US009805945B2

(12) United States Patent
Hidaka et al.

(10) Patent No.: US 9,805,945 B2
(45) Date of Patent: Oct. 31, 2017

(54) ETCHING METHOD

(71) Applicant: TOKYO ELECTRON LIMITED, Tokyo (JP)

(72) Inventors: Akira Hidaka, Miyagi (JP); Soichiro Kimura, Miyagi (JP); Masaru Sugimoto, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/184,049

(22) Filed: Jun. 16, 2016

(65) Prior Publication Data

US 2016/0379841 A1 Dec. 29, 2016

(30) Foreign Application Priority Data

Jun. 24, 2015 (JP) ................................. 2015-126710

(51) Int. Cl.
*H01L 21/311* (2006.01)
(52) U.S. Cl.
CPC .. *H01L 21/31116* (2013.01); *H01L 21/31122* (2013.01); *H01L 21/31144* (2013.01)

(58) Field of Classification Search
CPC ..................... H01L 21/31116; H01L 21/31144
See application file for complete search history.

(56) References Cited

FOREIGN PATENT DOCUMENTS

JP 2000-307001 A 11/2000

*Primary Examiner* — Nadine Norton
*Assistant Examiner* — Mahmoud Dahimene
(74) *Attorney, Agent, or Firm* — Rothwell, Figg, Ernst & Manbeck, P.C.

(57) ABSTRACT

Disclosed is a method for selectively etching a first region made of silicon oxide to a second region made of silicon nitride. The method includes: performing a first sequence once or more to etch the first region; and performing a second sequence once or more to further etch the first region. The first sequence includes: a first step of generating plasma of a processing gas containing a fluorocarbon to form a fluorocarbon-containing deposit on a workpiece; and a second step of etching the first region by radicals of the fluorocarbon. The second sequence includes: a third step of generating plasma of a processing gas containing a fluorocarbon gas to form a fluorocarbon-containing deposit on a workpiece; and a fourth step of generating plasma of a processing gas containing oxygen gas and an inert gas in the processing container.

10 Claims, 20 Drawing Sheets

ETCHING METHOD

CROSS-REFERENCE TO RELATED APPLICATIONS

This application is based on and claims priority from Japanese Patent Application No. 2015-126710 filed on Jun. 24, 2015 with the Japan Patent Office, the disclosure of which is incorporated herein in its entirety by reference.

TECHNICAL FIELD

An exemplary embodiment of the present disclosure relates to an etching method, specifically, a method for selectively etching a first region made of silicon oxide to a second region made of silicon nitride.

BACKGROUND

In manufacturing electronic devices, a processing may be performed on a region made of silicon oxide ($SiO_2$) to form openings (e.g., holes or trenches) in some cases. In such a processing, a workpiece is generally exposed to plasma of a fluorocarbon gas, so that the region is etched, as described in U.S. Pat. No. 7,708,859.

Further, a technique for selectively etching a first region made of silicon oxide to a second region made of silicon nitride has been known. As an example of the technique, a self-aligned contact (SAC) technique has been known. As for the SAC technique, see Japanese Patent Laid-Open Publication No. 2000-307001.

A workpiece, which is a processing target of the SAC technique, includes a first region made of silicon oxide, a second region made of silicon nitride, and a mask made of a predetermined material. The second region is provided to define a recess, the first region is provided to fill the recess and cover the second region, and the mask is provided on the first region and provides an opening above the recess. In the conventional SAC technique, as described in Japanese Patent Laid-Open Publication No. 2000-307001, in order to etch the first region, plasma of a processing gas containing a fluorocarbon gas, oxygen gas, and a noble gas is generated, and the workpiece is exposed to active species of fluorine and/or fluorocarbon. Thus, the first region is etched in a portion exposed from the opening of the mask, so that an upper opening is formed. Further, since the workpiece is exposed to the active species, the first region in a portion surrounded by the second region, that is, in the recess, is etched in a self-aligned manner. Thus, a lower opening continuous with the upper opening is formed in a self-aligned manner.

SUMMARY

In an aspect, the present disclosure provides a method for selectively etching a first region made of silicon oxide to a second region made of silicon nitride. The second region defines a recess, the first region is provided to fill the recess and cover the second region, and a mask made of a predetermined material (e.g., an organic film) is provided on the first region. The method includes: performing a first sequence once or more to etch the first region; and performing a second sequence once or more to further etch the first region. The first sequence includes: (i) a first step of generating plasma of a processing gas containing a fluorocarbon gas in a processing container of a plasma processing apparatus to form a fluorocarbon-containing deposit on a workpiece including the first region and the second region; and (ii) a second step of etching the first region by radicals of the fluorocarbon contained in the deposit. The performing the second sequence once or more is applied to the workpiece processed by the performing the first sequence once or more. The second sequence includes: (iii) a third step of generating plasma of a processing gas containing a fluorocarbon gas in the processing container to form a fluorocarbon-containing deposit on a workpiece including the first region and the second region; and (iv) a fourth step of generating plasma of a processing gas containing oxygen gas and an inert gas in the processing container.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
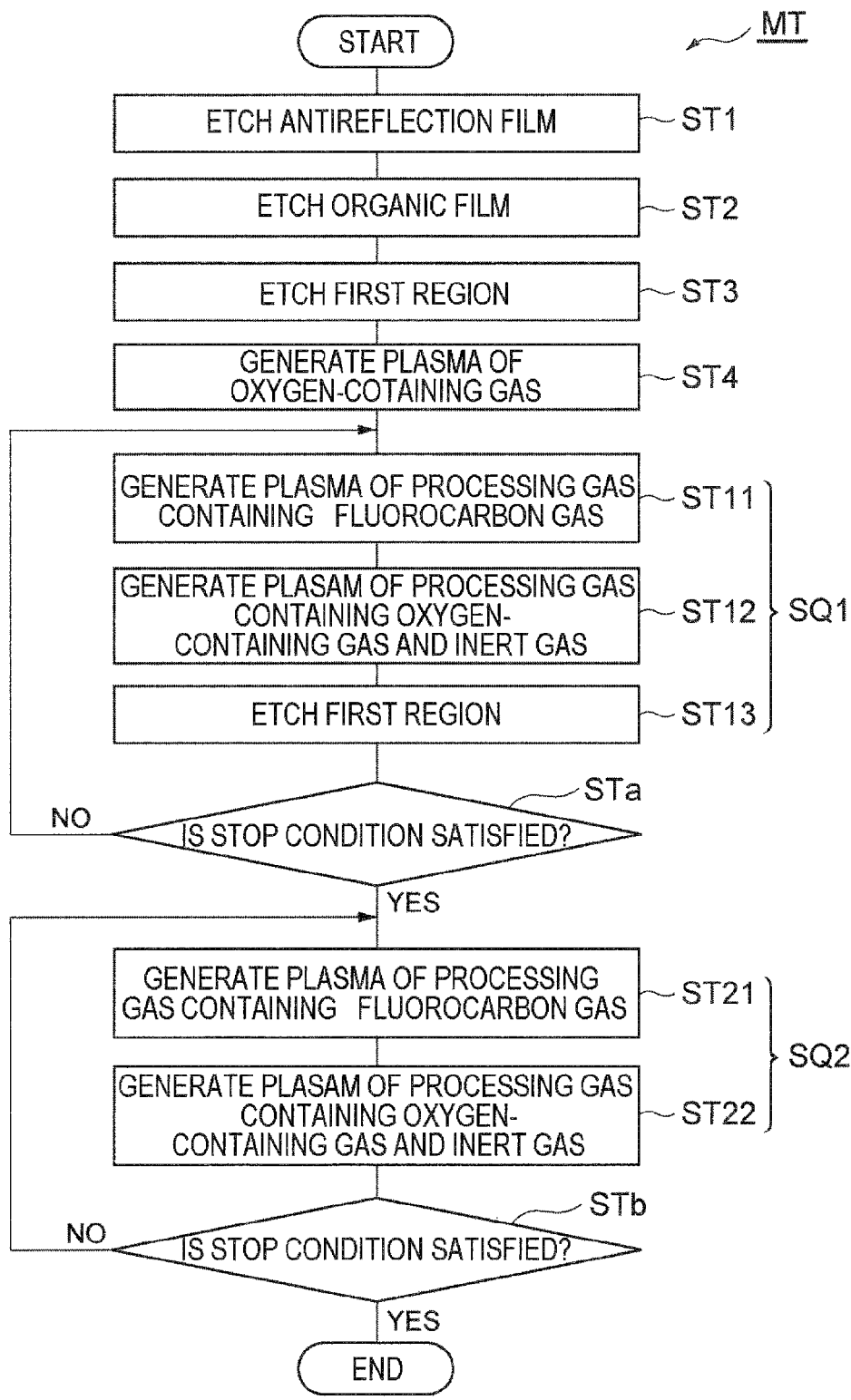
FIG. 1 is a flowchart illustrating an etching method according to an exemplary embodiment.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

In the SAC technique described above, when the second region is exposed by the etching of the first region, the second region is exposed to active species in an unprotected state. Thus, the second region is eroded.

In order to suppress the erosion of the second region, the present inventors have developed a technique of performing a sequence including forming a fluorocarbon-containing deposit on the workpiece and etching the first region by radicals of the fluorocarbon in the deposit. According to the technique, the deposit may function as a protective film of the second region when the second region is exposed. Further, the deposit may also function as a source of radicals for the etching of the first region. Thus, according to the technique, it is possible to etch the first region while suppressing erosion of the second region.

The deposit is also formed in a portion along the sidewall surface of the second region that defines the recess. That is, the deposit is partially formed along the sidewall surface of the second region that defines the recess. The deposit formed along the sidewall surface suppresses etching of the first region in a portion adjacent to the sidewall surface, and causes a residue of the first region in the portion adjacent to the sidewall surface. As a result, the width of the bottom portion of the opening formed in the recess becomes narrow as compared with the width of the upper portion of the opening. Thus, it is required to reduce the amount of the residue. As a measure to reduce the amount of the residue, it is considered to reduce the film thickness of the deposit. However, this measure causes erosion of the second region.

For this reason, it is necessary to suppress erosion of the second region made of silicon nitride in the etching of the first region made of silicon oxide, and to reduce the residue in the recess defined by the second region.

In an aspect, the present disclosure provides a method for selectively etching a first region made of silicon oxide to a second region made of silicon nitride. The second region defines a recess, the first region is provided to fill the recess and cover the second region, and a mask made of a predetermined material (e.g., an organic film) is provided on the first region. The method includes: performing a first sequence once or more to etch the first region; and performing a second sequence once or more to further etch the first region. The first sequence includes: (i) a first step of generating plasma of a processing gas containing a fluorocarbon gas in a processing container of a plasma processing apparatus to form a fluorocarbon-containing deposit on a workpiece including the first region and the second region; and (ii) a second step of etching the first region by radicals of the fluorocarbon contained in the deposit. The performing the second sequence once or more is applied to the workpiece processed by the performing the first sequence once or more. The second sequence includes: (iii) a third step of generating plasma of a processing gas containing a fluorocarbon gas in the processing container to form a fluorocarbon-containing deposit on a workpiece including the first region and the second region; and (iv) a fourth step of generating plasma of a processing gas containing oxygen gas and an inert gas in the processing container.

The deposit formed on the workpiece in the first step functions as a film protecting the second region with respect to the second region, and functions as a source of radicals for etching the first region in the second step with respect to the first region. The fluorocarbon in the deposit reacts with silicon oxide of the first region in the second step, and etches the first region. Thus, according to the first sequence, it is possible to etch the first region while suppressing the erosion of the second region.

In the third step of the second sequence, the fluorocarbon-containing deposit is formed on the workpiece after the performance of the first sequence in order to protect the second region as well as to form a source of radicals for removing the residue of the first region. In the subsequent fourth step, plasma of the oxygen gas is generated in order to reduce the deposit formed along the sidewall surface of the second region that defines the recess. Further, in the fourth step, the reaction of the deposit and the residue of the first region in the recess is facilitated by the active species derived from the plasma of the inert gas, so that the residue is reduced. Therefore, according to the method of an aspect, the erosion of the second region is suppressed, and the residue of the first region in the recess defined by the second region is reduced.

In an exemplary embodiment, a power of high frequency waves used for generating the plasma in the third step is set to be greater than a power of high frequency waves used for generating the plasma in the first step. According to the exemplary embodiment, it is possible to supply the fluorocarbon in a dissociated form suitable for the removal of the residue in the recess, into the recess.

In an exemplary embodiment, the workpiece is placed on a placing table in the processing container. A pressure in a space in the processing container set in the fourth step is higher than a pressure in a space in the processing container set in the first step. A power of a high frequency bias supplied to the placing table in the fourth step is smaller than a power of a high frequency bias supplied to the placing table in the first step. In the exemplary embodiment, a condition of a high pressure and a high bias is used in the fourth step. Under the condition of a high pressure and a low bias, the active species collides with the workpiece more isotropically, as compared with a condition of a low pressure and/or a high bias. Thus, it is possible to efficiently reduce the amount of the deposit formed along the sidewall surface of the second region and the residue.

In an exemplary embodiment, the first sequence may further include a step of generating plasma of a processing gas containing oxygen gas and an inert gas in the processing container. According to the exemplary embodiment, it is possible to reduce the amount of excessive deposit, and suppress excessive reduction in width or blockage of the opening formed by the opening of the mask and etching.

In an exemplary embodiment, the performing the first sequence once or more is performed during a period including a time when the second region is exposed. The method of the exemplary embodiment further includes etching the first region to the bottom of the recess by the plasma of the processing gas containing the fluorocarbon gas generated in the processing container, between the performing the first sequence once or more and the performing the second sequence ones or more. According to the exemplary embodiment, it is possible to etch the first region to the bottom of the recess in a more shortened time, and then, reduce the residue in the recess.

As described above, it is possible to suppress erosion of the second region made of silicon nitride in the etching of the first region made of silicon oxide, and to reduce the residue in the recess defined by the second region.

Hereinafter, various exemplary embodiments will be described in detail with reference to the drawings. In addition, in the respective drawings, the same or corresponding parts will be denoted by the same symbol.

FIG. 1 is a flowchart illustrating an etching method according to an exemplary embodiment. Method MT illustrated in FIG. 1 is a method for selectively etching a first region made of silicon oxide to a second region made of silicon nitride by a plasma processing on a workpiece.

Figure 2:
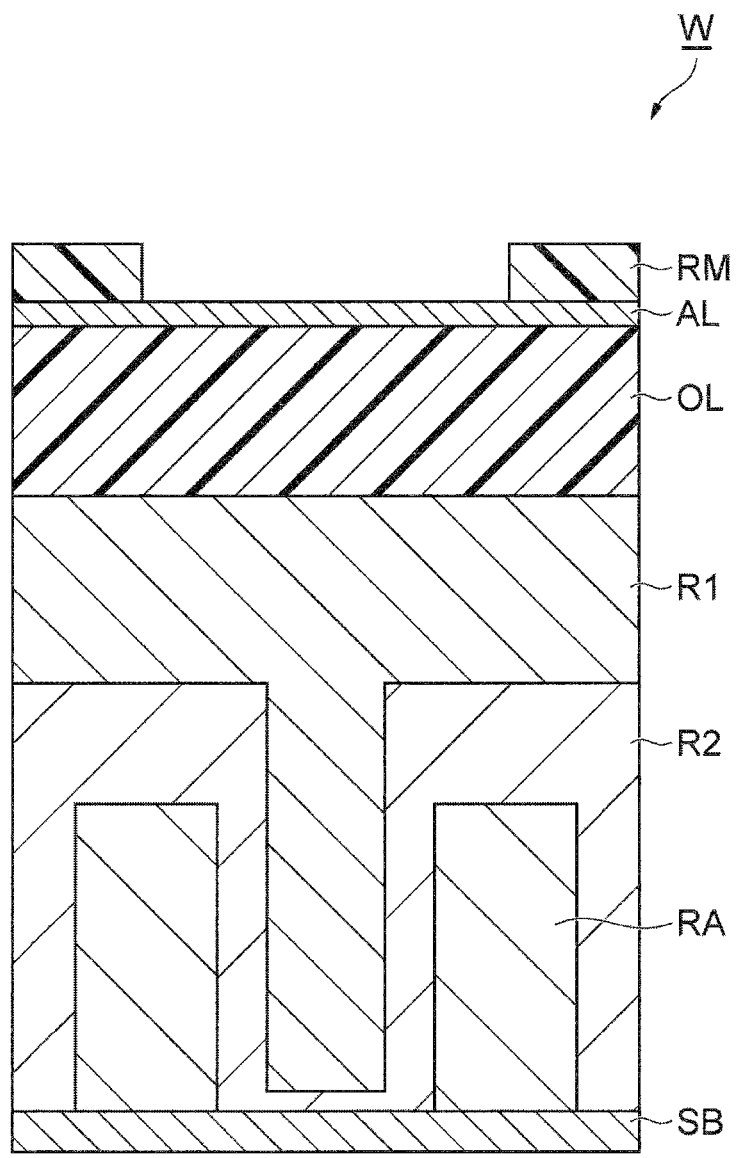
FIG. 2 is a cross-sectional view illustrating an exemplary workpiece.

FIG. 2 is a cross-sectional view illustrating an exemplary workpiece. As illustrated in FIG. 2, the workpiece (hereinafter, referred to as a "wafer W" in some cases) includes a substrate SB, a first region R1, a second region R2, and an organic film OL, which will constitute a mask later. In an example, the wafer W is obtained in manufacturing a pin type field effect transistor, and includes a raised area RA, a silicon-containing antireflection film AL, and a resist mask RM.

The raised area RA is provided to be raised from the substrate SB. The raised area RA may constitute, for example, a gate area. The second region R2 is made of silicon nitride ($Si_3N_4$), and provided on the surface of the raised area RA and the surface of the substrate SB. As illustrated in FIG. 2, the second region R2 extends to define a recess. In an example, the depth of the recess is about 150 nm, and the width of the recess is about 20 nm.

The first region R1 is made of silicon oxide $SiO_2$, and provided on the second region R2. Specifically, the first region R1 is provided to fill the recess defined by the second region R2, and cover the second region R2.

The organic film OL is provided on the first region R1. The organic film OL may be made of an organic material, for example, amorphous carbon. The antireflection film AL is provided on the organic film OL. The resist mask RM is provided on the antireflection film AL. The resist mask RM provides, on the recess defined by the second region R2, an opening having a width wider than the width of the recess. The width of the opening of the resist mask RM is, for example, 60 nm. Such a pattern of the resist mask RM is formed by a photolithography technique.

Figure 3:
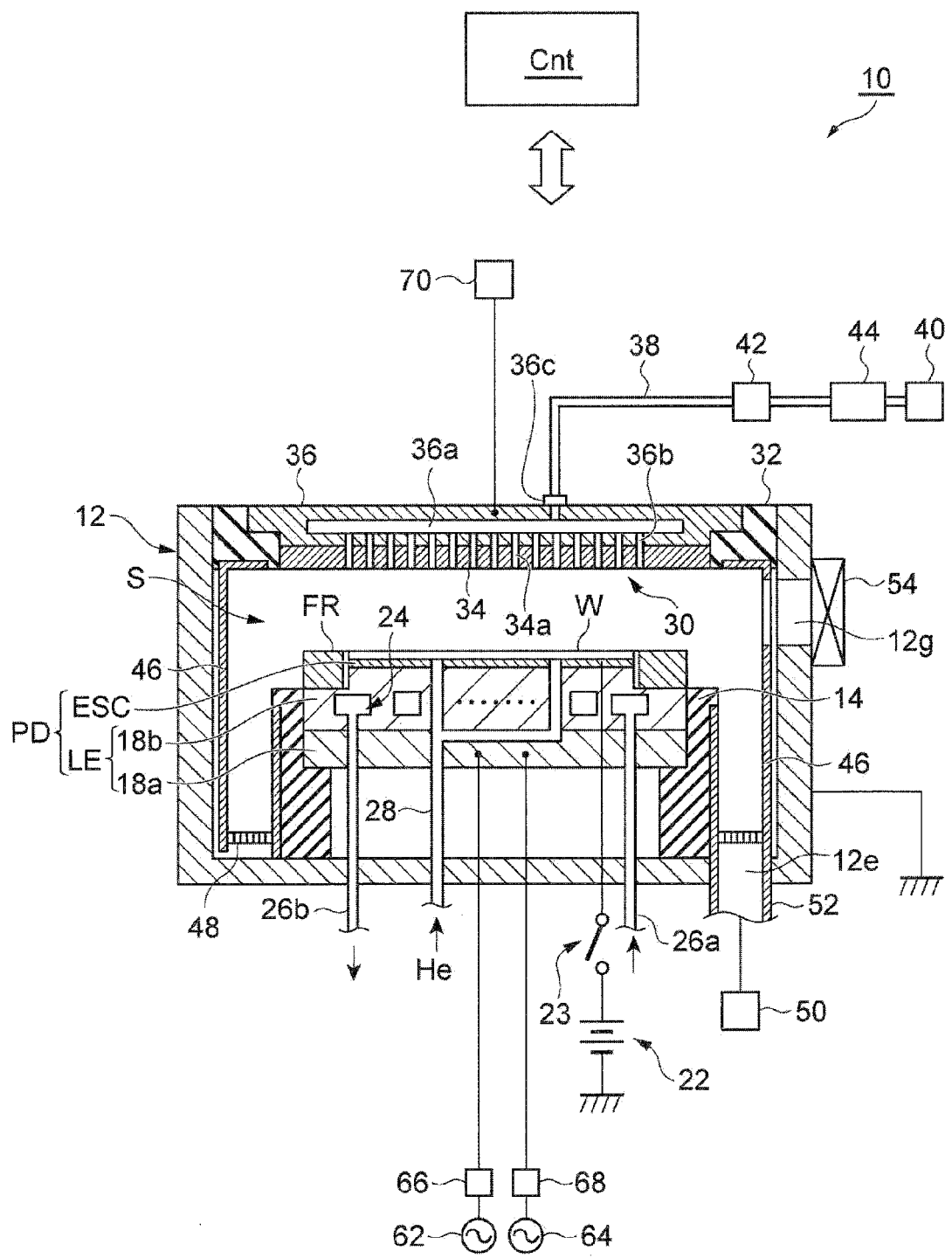
FIG. 3 is a schematic view illustrating an exemplary plasma processing apparatus.

In method MT, the workpiece such as the wafer illustrated in FIG. 2 is processed in a plasma processing apparatus. FIG. 3 is a schematic view illustrating an exemplary plasma processing apparatus. The plasma processing apparatus 10 illustrated in FIG. 3 is a capacitively coupled plasma etching apparatus, and includes a substantially cylindrical processing container 12. The processing container 12 is made of, for example, aluminum, and the inner wall surface of the processing container 12 is subjected to anodizing treatment. The processing container 12 is grounded for safety.

A substantially cylindrical support 14 is provided above the bottom portion of the processing container 12. The support 14 is made of, for example, an insulating material. The support 14 extends vertically from the bottom portion of the processing container 12 in the processing container 12.

Further, a placing table PD is provided in the processing container 12. The placing table PD is supported by the support 14.

The placing table PD holds the wafer W on the top surface thereof. The placing table PD includes a lower electrode LE and an electrostatic chuck ESC. The lower electrode LE includes a first plate 18a and a second plate 18b. The first plate 18a and the second plate 18b are made of a metal such as, for example, aluminum, and have a substantially disc shape. The second plate 18b is provided on the first plate 18a, and electrically connected to the first plate 18a.

The electrostatic chuck ESC is provided on the second plate 18b. The electrostatic chuck ESC has a structure in which an electrode made of a conductive film is disposed between insulating layers or insulating sheets. The electrode of the electrostatic chuck ESC is electrically connected with a DC power source 22 via a switch 23. The electrostatic chuck ESC attracts the wafer W through an electrostatic force such as, for example, a Coulomb force caused by a DC voltage from the DC power source 22. Therefore, the electrostatic chuck ESC is capable of holding the wafer W.

A focus ring FR is disposed on the periphery of the second plate 18b to surround the edge of the wafer W and the electrostatic chuck ESC. The focus ring FR is provided to enhance the uniformity of the etching. The focus ring FR is made of a material appropriately selected from materials of an etching target film, and may be made of, for example, quartz.

A coolant flow path 24 is provided inside the second plate 18b. The coolant flow path 24 constitutes a temperature adjustment mechanism. The coolant flow path 24 is supplied with a coolant from a chiller unit provided outside the processing container 12, through a pipe 26a. The coolant supplied to the coolant flow path 24 is returned to the chiller unit through a pipe 26b. In this manner, the coolant is circulated between the coolant flow path 24 and the chiller unit. The temperature of the wafer W supported by the electrostatic chuck ESC is controlled by controlling the temperature of the coolant.

Further, a gas supply line 28 is provided in the plasma processing apparatus 10. The gas supply line 28 supplies a heat transfer gas, for example, helium (He) gas from a heat transfer gas supply mechanism to a gap between the top surface of the electrostatic chuck ESC and the rear surface of the wafer W.

Further, the plasma processing apparatus 10 includes an upper electrode 30. The upper electrode 30 is disposed above the placing table PD to face the placing table PD. The lower electrode LE and the upper electrode 30 are provided substantially in parallel with each other. A processing space S is provided between the upper electrode 30 and the placing table PD to perform a plasma processing on the wafer W.

The upper electrode 30 is supported in the upper portion of the processing container 12 through an insulating shielding member 32. In an exemplary embodiment, the upper electrode 30 may be configured such that its distance in vertical direction from the top surface of the placing table PD (i.e., the wafer placing surface) is variable. The upper electrode 30 may include a top plate 34 and a support 36. The top plate 34 faces the processing space S, and a plurality of gas ejection holes 34a are formed in the top plate 34. In an exemplary embodiment, the top plate 34 is made of silicon.

The support 36 configured to detachably support the top plate 34, and may be made of a conductive material such as, for example, aluminum. The support 36 may have a water-cooled structure. A gas diffusion chamber 36a is provided inside the support 36. In the gas diffusion chamber 36a, a plurality of gas flowing holes 36b extend downward to be in communication with the gas ejection holes 34a, respectively. Further, the support 36 includes a gas introduction port 36c configured to introduce the processing gas to the gas diffusion chamber 36a. The gas introduction port 36c is connected with a gas supply pipe 38.

The gas supply pipe 38 is connected with a gas source group 40 via a valve group 42 and a flow rate controller group 44. The gas source group 40 includes a plurality of gas sources. In an example, the gas source group 40 includes a source of one or more fluorocarbon gases, a source of a noble gas, a source of nitrogen gas ($N_2$ gas), a source of hydrogen gas ($H_2$ gas), and a source of an oxygen-containing gas. In an example, the source of one or more fluorocarbon gases may include a source of $C_4F_8$ gas, a source of $CF_4$ gas, and a source of $C_4F_6$ gas. The source of a noble gas may be a source of any noble gas such as, for example, He gas, Ne gas, Ar gas, Kr gas, or Xe gas, and in an example, a source of Ar gas. The source of the oxygen-containing gas may be, for example, a source of oxygen gas ($O_2$ gas). Further, the oxygen-containing gas may be any gas containing oxygen, or a carbon oxide gas such as, for example, CO gas or $CO_2$ gas.

The valve group 42 includes a plurality of valves, and the flow rate controller group 44 includes a plurality of flow rate controllers such as, for example, mass flow controllers. The plurality of gas sources of the gas source group 40 are connected to the gas supply pipe 38 via valves corresponding to the valve group 42 and the flow rate controllers corresponding to the flow rate controller group 44, respectively.

Further, in the plasma processing apparatus 10, a deposition shield 46 is provided detachably along the inner wall of the processing container 12. The deposition shield 46 is provided in the outer periphery of the support 14 as well. The deposition shield 46 serves to suppress any etching byproduct (deposit) from being attached to the processing container 12, and may be formed by coating a ceramic (e.g., $Y_2O_3$) on an aluminum material.

An exhaust plate 48 is provided at the bottom portion side of the processing container 12 between the support 14 and the sidewall of the processing container 12. The exhaust plate 48 includes a plurality of through-holes formed to penetrate the exhaust plate 48 in the plate thickness direction. The exhaust plate 48 may be formed by coating a ceramic (e.g., $Y_2O_3$) on an aluminum material. An exhaust port 12e is formed at the lower side of the exhaust plate 48 in the processing container 12. An exhaust port 12e is connected with an exhaust device 50 via an exhaust pipe 52. The exhaust device 50 includes a pressure adjustment valve and a vacuum pump such as, for example, a turbo molecular pump, and is capable of decompressing the space in the processing container 12 to a desired degree of vacuum. A carry-in/out port 12g of the wafer W is formed in the sidewall of the processing container 12. The carry-in/out port 12g is configured to be opened/closed by a gate valve 54.

Further, the plasma processing apparatus 10 further includes a first high frequency power source 62 and a second high frequency power source 64. The first high frequency power source 62 is a power source that generates high frequency waves for plasma generation, and, for example, generates high frequency at a frequency of 27 MHz to 100 MHz. The first high frequency power source 62 is connected to the lower electrode LE via the matcher 66. The matcher 66 includes a circuit to match the output impedance of the first high frequency power source 62 and the input impedance of the load side (the lower electrode LE side). The first high frequency power source 62 may be connected to the upper electrode 30 via a matcher 66.

The second high frequency power source 64 is a power source that generates a high frequency bias for drawing ions into the wafer W, and, for example, generates a high frequency bias at a frequency in a range of 400 kHz to 13.56 MHz. The second high frequency power source 64 is connected to the lower electrode LE via a matcher 68. The matcher 68 includes a circuit to match the output impedance of the second high frequency power source 64 and the input impedance of the load side (the lower electrode LE side).

Further, the plasma processing apparatus 10 further includes a power source 70. The power source 70 is connected to the upper electrode 30. The power source 70 applies a voltage to the upper electrode 30 to draw positive ions present in the processing space S into the top plate 34. In an example, the power source 70 is a DC power source that generates a negative DC voltage. In another example, the power source 70 may be an AC power source that generates an AC voltage of a relatively low frequency. The voltage applied from the power source 70 to the upper electrode may be a voltage of −150 V or less. That is, the voltage applied to the upper electrode 30 by the power source 70 may be a negative voltage of which the absolute value is 150 V or more. When such a voltage is applied from the power source 70 to the upper electrode 30, the positive ions present in the processing space S collide with the top plate 34. Accordingly, secondary electrons and/or silicon are released from the top plate 34. The released silicon is bonded to the active species of fluorine present in the processing space S, so that the amount of the active species of fluorine is reduced.

Further, in an exemplary embodiment, the plasma processing apparatus 10 may further include a controller Cnt. The controller Cnt is a computer including, for example, a processor, a storage unit, an input device, and a display device, and controls respective parts of the plasma processing apparatus 10. In the controller Cnt, an operator may execute an input operation of a command using the input device to manage the plasma processing apparatus 10, and may visualize and display the operation status of the plasma processing apparatus 10. Further, the storage unit of the controller Cnt stores a control program for controlling various processings to be performed in the plasma processing apparatus 10 by the processor, or a program for performing a processing on respective parts of the plasma processing apparatus 10 in accordance with a processing condition, that is, a processing recipe.

Figure 16:
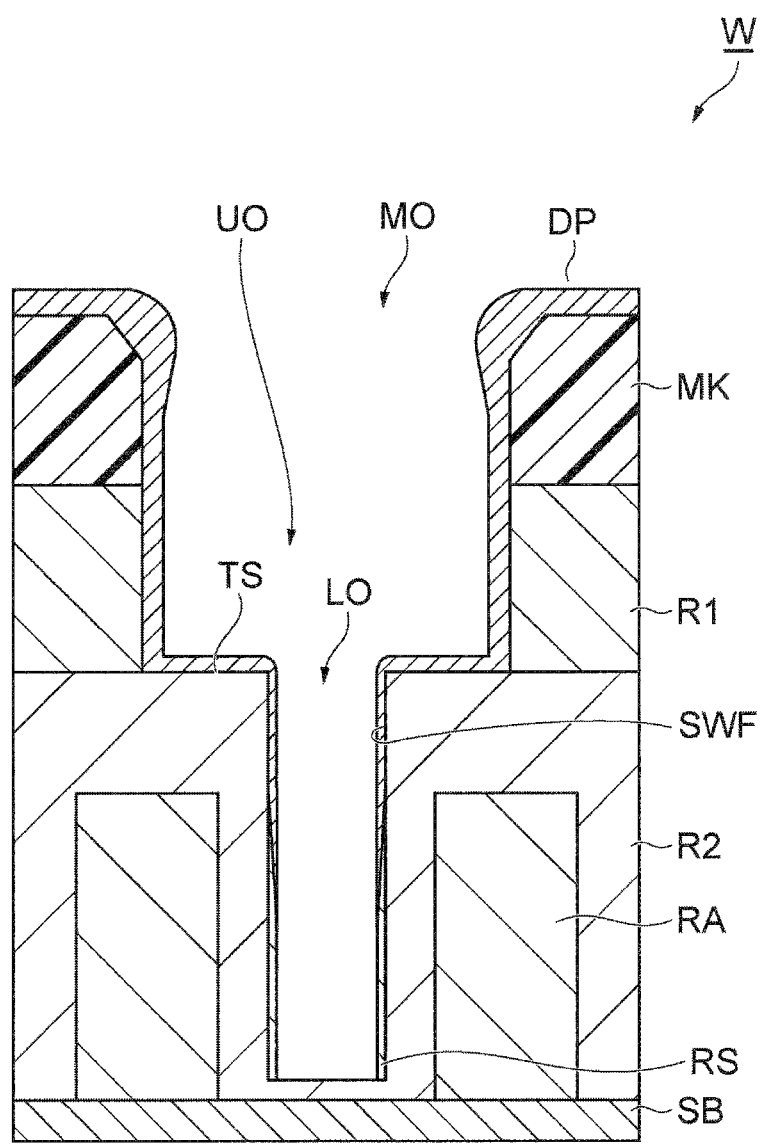
FIG. 16 is a cross-sectional view illustrating the workpiece in a stage during the performance of the method illustrated in FIG. 1.
Figure 17:
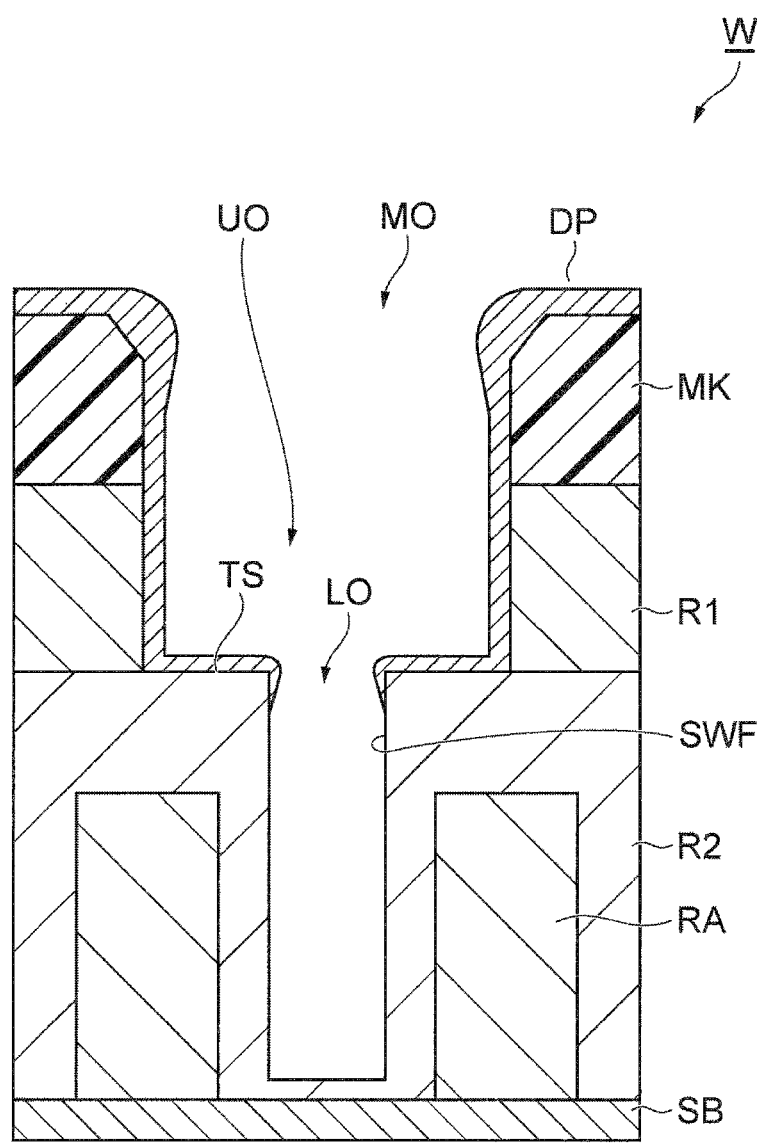
FIG. 17 is a cross-sectional view illustrating the workpiece in a stage during the performance of the method illustrated in FIG. 1.

Referring back to FIG. 1, method MT will be described in detail. Hereinafter, FIGS. 2 and 4 to 17 will be referred together with FIG. 1, as appropriate. FIGS. 4 to 16 are cross-sectional views illustrating the workpiece in a stage during the performance of the method illustrated in FIG. 1, and FIG. 17 is a cross-sectional view illustrating the workpiece after the performance of the method illustrated in FIG. 1. In the following, descriptions will be made on a case where the wafer W illustrated in FIG. 2 is processed using a single plasma processing apparatus 10 illustrated in FIG. 3 in method MT. Further, in each step of method MT performed using the plasma processing apparatus 10, operations of respective parts of the plasma processing apparatus 10 may be controlled by the controller Cnt.

First, in method MT, the wafer W illustrated in FIG. 2 is carried into the plasma processing apparatus 10, and the wafer W is placed on the placing table PD and is held by the electrostatic chuck ESC of the placing table PD.

In method MT, step ST1 is then performed. In step ST1, the antireflection film AL is etched. Therefore, in step ST1, the processing gas is supplied into the processing container 12 from a gas source selected among the plurality of gas sources of the gas source group 40. The processing gas contains a fluorocarbon gas. The fluorocarbon gas may include, for example, one or more selected from $C_4F_8$ gas and $CF_4$ gas. The processing gas may further contain a noble gas, for example, Ar gas. Further, in step ST1, the exhaust device 50 is operated, so that the pressure in the processing container 12 is set to a predetermined pressure. Further, in step ST1, the high frequency waves from the first high frequency power source 62 are supplied to the lower electrode LE, and the high frequency bias from the second high frequency power source 64 is supplied to the lower electrode LE.

Hereinafter, various conditions in step ST1 are exemplified.

Figure 4:
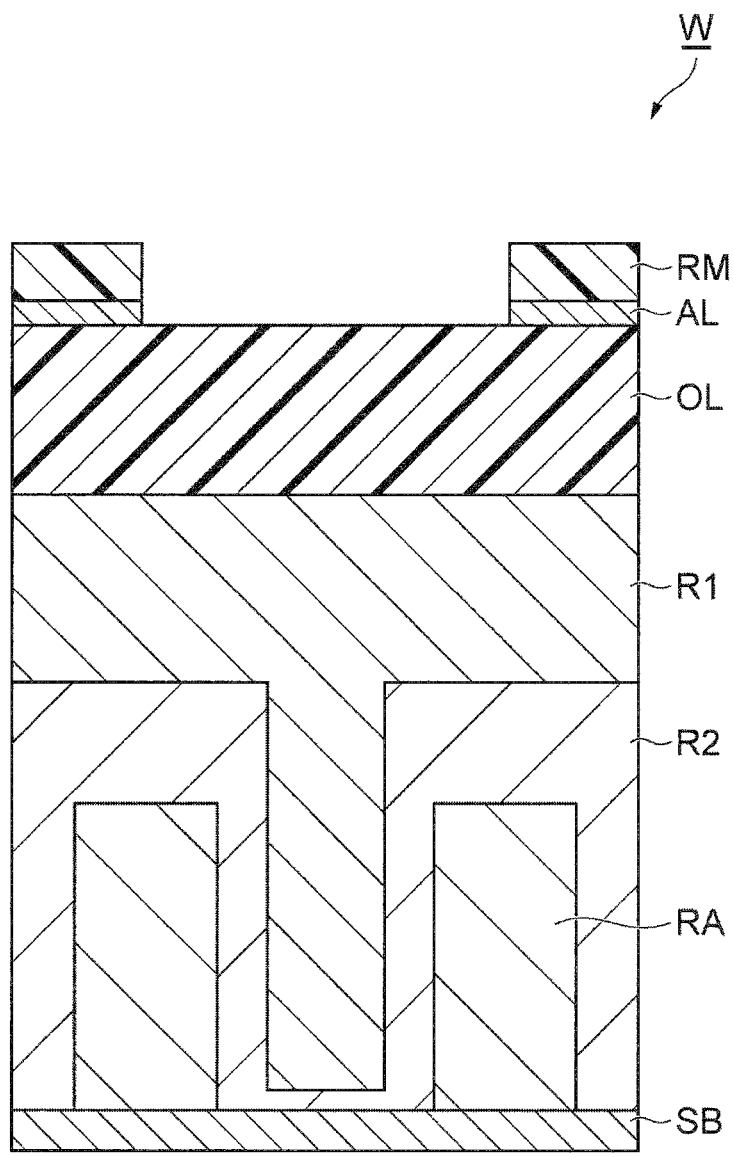
FIG. 4 is a cross-sectional view illustrating the workpiece in a stage during the performance of the method illustrated in FIG. 1.

Pressure in processing container: 10 mTorr (1.33 Pa) to 50 mTorr (6.65 Pa)
Processing gas
  $C_4F_8$ gas: 10 sccm to 30 sccm
  $CF_4$ gas: 150 sccm to 300 sccm
  Ar gas: 200 sccm to 500 sccm
Power of high frequency waves for plasma generation: 300 W to 1,000 W
Power of high frequency bias: 200 W to 500 W In step ST1, plasma of the processing gas is generated, and the antireflection film AL is etched in a portion exposed from the opening of the resist mask RM, by the active species of fluorocarbon and/or fluorine. As a result, as illustrated in FIG. 4, among the entire regions of the antireflection film AL, the portion exposed from the resist mask RM is removed. That is, the pattern of the resist mask RM is transferred to the antireflection film AL, so that a pattern providing an opening is formed in the antireflection film AL.

In the subsequent step ST2, the organic film OL is etched. Therefore, in step ST2, the processing gas is supplied into the processing container 12 from a gas source selected among the plurality of gas sources of the gas source group 40. The processing gas may contain hydrogen gas and nitrogen gas. Further, the processing gas used in step ST2 may be a processing gas containing other gases, for example, oxygen gas, as long as it can etch the organic film. Further, in step ST2, the exhaust device 50 is operated, so that the pressure in the processing container 12 is set to a predetermined pressure. Further, in step ST2, the high frequency waves from the first high frequency power source 62 are supplied to the lower electrode LE, and the high frequency bias from the second high frequency power source 64 is supplied to the lower electrode LE.

Hereinafter, various conditions in step ST2 are exemplified.

Figure 5:
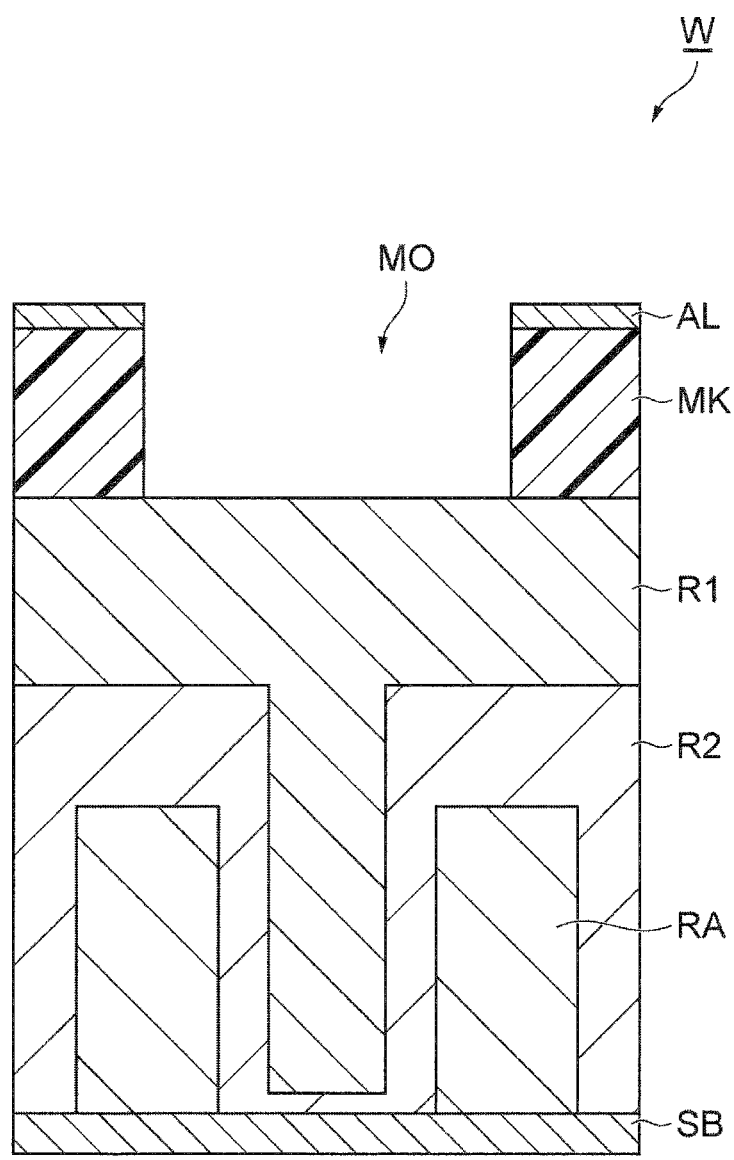
FIG. 5 is a cross-sectional view illustrating the workpiece in a stage during the performance of the method illustrated in FIG. 1.

Pressure in processing container: 50 mTorr (6.65 Pa) to 200 mTorr (26.6 Pa)
Processing gas
  $N_2$ gas: 200 sccm to 400 sccm
  $H_2$ gas: 200 sccm to 400 sccm
Power of high frequency waves for plasma generation: 500 W to 2,000 W
Power of high frequency bias: 200 W to 500 W In step ST2, plasma of the processing gas is generated, and the organic film OL is etched in a portion exposed from the opening of the antireflection film AL. Further, the resist mask RM is also etched. As a result, as illustrated in FIG. 5, the resist mask RM is removed, and among the entire regions of the organic film OL, the portion exposed from the antireflection film AL is removed. That is, the pattern of the antireflection film AL is transferred to the organic film OL, and the pattern providing an opening MO is formed in the organic film OL, and a mask MK is produced from the organic film OL.

In an exemplary embodiment, step ST3 is performed after the performance of step ST2. In step ST3, the first region R1 is etched until just before the second region R2 is exposed. That is, the first region R1 is etched until a trace amount of the first region R1 is left on the second region R2. Therefore, in step ST3, the processing gas is supplied into the processing container 12 from a gas source selected among the plurality of gas sources of the gas source group 40. The processing gas contains a fluorocarbon gas. The processing gas may further contain a noble gas, for example, Ar gas. Further, the processing gas may further contain oxygen gas. Further, in step ST3, the exhaust device 50 is operated, so that the pressure in the processing container 12 is set to a predetermined pressure. Further, in step ST3, the high frequency waves from the first high frequency power source 62 are supplied to the lower electrode LE, and the high frequency bias from the second high frequency power source 64 is supplied to the lower electrode LE.

Figure 6:
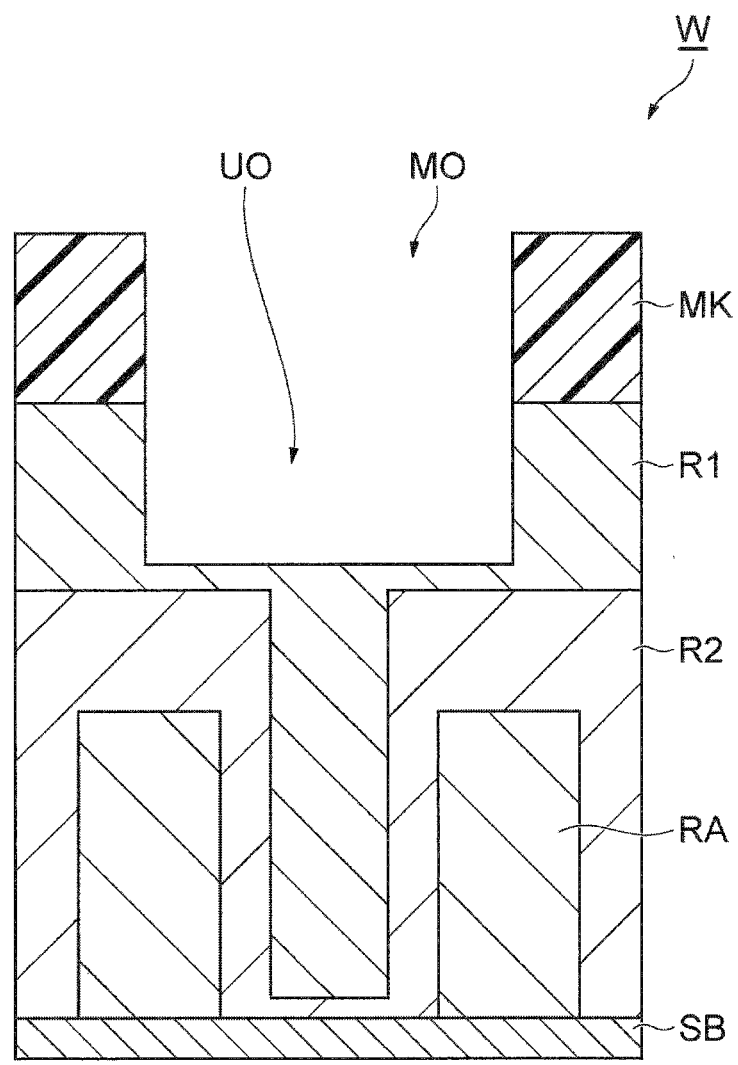
FIG. 6 is a cross-sectional view illustrating the workpiece in a stage during the performance of the method illustrated in FIG. 1.

In step ST3, plasma of the processing is generated, and the first region R1 is etched in a portion exposed from the opening of the mask MK, by the active species of fluorocarbon and/or fluorine. The processing time of step ST3 is set such that the first region R1 is left in a predetermined thickness on the second region R2 at the time of the end of step ST3. As a result of the performance of step ST3, as illustrated in FIG. 6, an upper opening UO is partially formed.

Further, in step ST11 (to be described later), a condition is set as a mode in which the formation of the fluorocarbon-containing deposit on the surface of the wafer W including the first region R1 is dominant to the etching of the first region R1 in step ST3, that is, a deposition mode. Meanwhile, in step ST3, a condition is set as a mode in which the etching of the first region R1 is dominant to the formation of the deposit, that is, an etching mode. Thus, in an example, the fluorocarbon gas used in step ST3 may include, for example, one or more selected from $C_4F_8$ gas and $CF_4$ gas. The fluorocarbon gas of this example is a fluorocarbon gas in which a ratio of the number of fluorine atoms to the number of carbon atoms (i.e., the number of fluorine atoms/the number of carbon atoms) is higher than a ratio of the number of fluorine atoms to the number of carbon atoms (i.e., the number of fluorine atoms/the number of carbon atoms) of the fluorocarbon gas used in step ST11. Further, in an example, in order to enhance a dissociation rate of fluorocarbon, the power of the high frequency waves for plasma generation used in step ST3 may be set to be greater than the power of the high frequency waves for plasma generation used in step ST11. According to the example, it is possible to realize the etching mode. Further, in an example, the power of the high frequency bias used in step ST3 may also be set to be greater than the power of the high frequency bias of step ST11. According to the example, the energy of ions drawn into the wafer W is increased, so that the first region R1 may be etched at a high speed.

Hereinafter, various conditions in step ST3 are exemplified.

Pressure in processing container: 10 mTorr (1.33 Pa) to 50 mTorr (6.65 Pa)
Processing gas
  $C_4F_8$ gas: 10 sccm to 30 sccm
  $CF_4$ gas: 50 sccm to 150 sccm
  Ar gas: 500 sccm to 1,000 sccm
  $O_2$ gas: 10 sccm to 30 sccm
Power of high frequency waves for plasma generation: 500 W to 2,000 W
Power of high frequency bias: 500 W to 2,000 W In method MT, step ST4 is then performed. In step ST4, plasma of the processing gas containing an oxygen-containing gas is generated in the processing container 12. Therefore, in step ST4, the processing gas is supplied into the processing container 12 from a gas source selected among the plurality of gas sources of the gas source group 40. In an example, the processing gas may contain oxygen gas as the oxygen-containing gas. Further, the processing gas may further contain an inert gas such as a noble gas (e.g., Ar gas) or nitrogen gas. Further, in step ST4, the exhaust device 50 is operated, so that the pressure in the processing container 12 is set to a predetermined pressure. Further, in step ST4, the power of the high frequency waves from the first high frequency power source 62 is supplied to the lower electrode LE. Further, in step ST4, the high frequency bias from the first high frequency power source 64 may not be supplied to the lower electrode LE.

Figure 7:
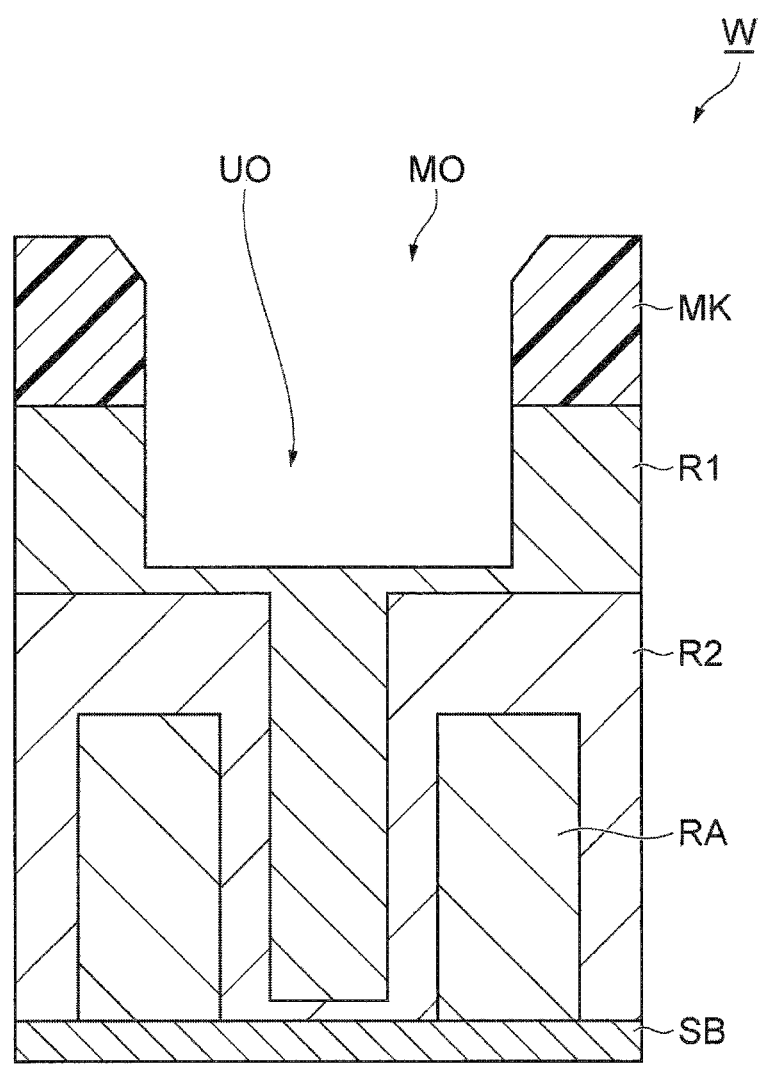
FIG. 7 is a cross-sectional view illustrating the workpiece in a stage during the performance of the method illustrated in FIG. 1.

In step ST4, active species of oxygen are generated, and the opening MO of the mask MK is widened in its upper end portion by the active species of oxygen. Specifically, as illustrated in FIG. 7, etching is performed such that the upper shoulder of the mask MK defining the upper end portion of the opening is tapered. Thus, even though a deposit produced in subsequent steps is attached to the surface defining the opening MO of the mask MK, the amount of reduction in width of the opening MO may be reduced.

Further, step ST12 (to be described later) is to reduce a trace amount of the deposit formed in each sequence, and it is necessary to suppress excessive reduction of the deposit. Meanwhile, step ST4 is performed to widen the width of the upper end portion of the opening MO of the mask MK, and a short processing time is required.

Hereinafter, various conditions in step ST4 are exemplified.

Pressure in processing container: 30 mTorr (3.99 Pa) to 200 mTorr (26.6 Pa)
Processing gas
  $O_2$ gas: 50 sccm to 500 sccm
  Ar gas: 200 sccm to 1,500 sccm
Power of high frequency waves for plasma generation: 100 W to 500 W
Power of high frequency bias: 0 W to 200 W Subsequently, in method MT, a sequence SQ1 is performed once or more to etch the first region R1. The sequence SQ1 is performed to etch the first region R1 during a period at least including the time when the second region R2 is exposed. In an exemplary embodiment, the sequence SQ1 is performed a plurality of times. The sequence SQ1 includes step ST11, step ST12, and step ST13.

Figure 8:
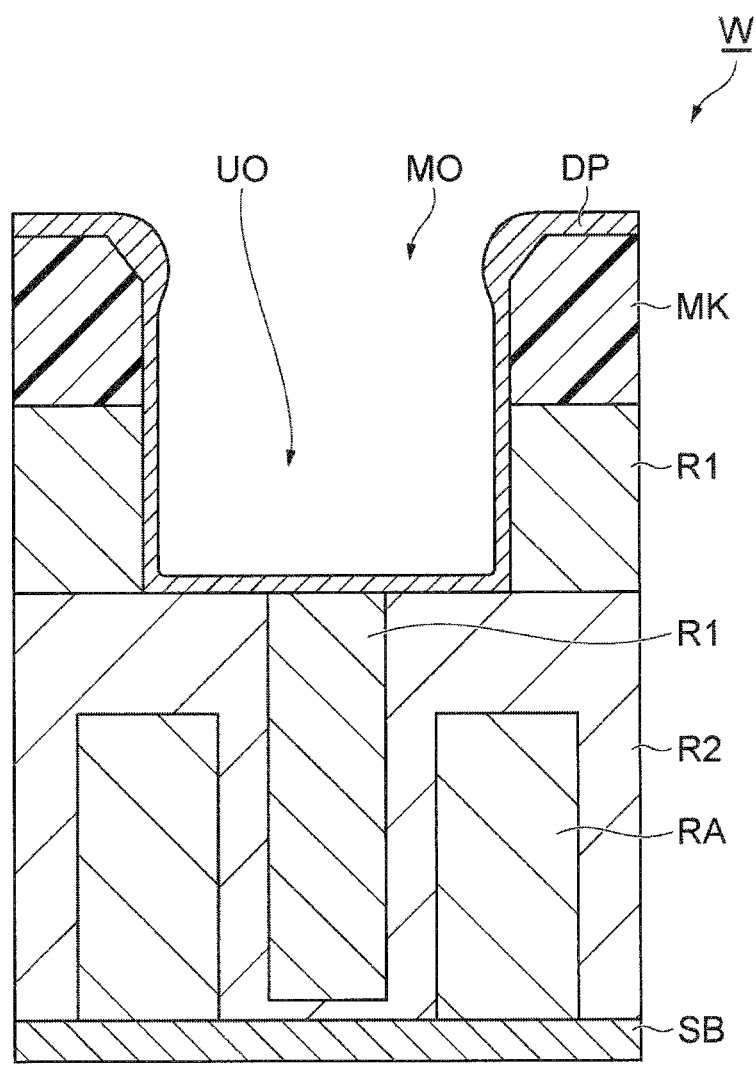
FIG. 8 is a cross-sectional view illustrating the workpiece in a stage during the performance of the method illustrated in FIG. 1.

In step ST11, plasma of a processing gas is generated in the processing container 12 in which the wafer W is accommodated. Therefore, in step ST11, the processing gas is supplied into the processing container 12 from a gas source selected among the plurality of gas sources of the gas source group 40. The processing gas contains a fluorocarbon gas. The processing gas may further contain a noble gas, for example, Ar gas. Further, in step ST11, the exhaust device 50 is operated, so that the pressure in the processing container 12 is set to a predetermined pressure. Further, in step ST11, the high frequency waves from the first high frequency power source 62 is supplied to the lower electrode LE. Furthermore, the high frequency bias from the second high frequency power source 64 may be supplied to the lower electrode LE. In step ST11, plasma of the processing gas containing the fluorocarbon gas is generated, and dissociated fluorocarbon is deposited on the surface of the wafer W, so that a deposit DP is formed as illustrated in FIG. 8.

As described above, in step ST11, a condition of the deposition mode is selected. Thus, in an example, $C_4F_6$ gas is used as the fluorocarbon gas.

Hereinafter, various conditions in step ST11 are exemplified.

Pressure in processing container: 10 mTorr (1.33 Pa) to 50 mTorr (6.65 Pa)
Processing gas
  $C_4F_6$ gas: 2 sccm to 10 sccm
  Ar gas: 500 sccm to 1,500 sccm
Power of high frequency waves for plasma generation: 100 W to 500 W
Power of high frequency bias: 0 W to 50 W In the subsequent step ST12, plasma of the processing gas containing an oxygen-containing gas and an inert gas is generated in the processing container 12. Therefore, in step ST12, the processing gas is supplied into the processing container 12 from a gas source selected among the plurality of gas sources of the gas source group 40. In an example, the processing gas contains oxygen gas as the oxygen-containing gas. Further, in an example, the processing gas contains a noble gas such as Ar gas, as the inert gas. The inert gas may be nitrogen gas. Further, in step ST12, the exhaust device 50 is operated, so that the pressure in the processing container 12 is set to a predetermined pressure. Further, in step ST12, the high frequency waves from the first high frequency power source 62 are supplied to the lower electrode LE. Further, in step ST12, the high frequency bias from the first high frequency power source 64 may not be supplied to the lower electrode LE.

Figure 9:
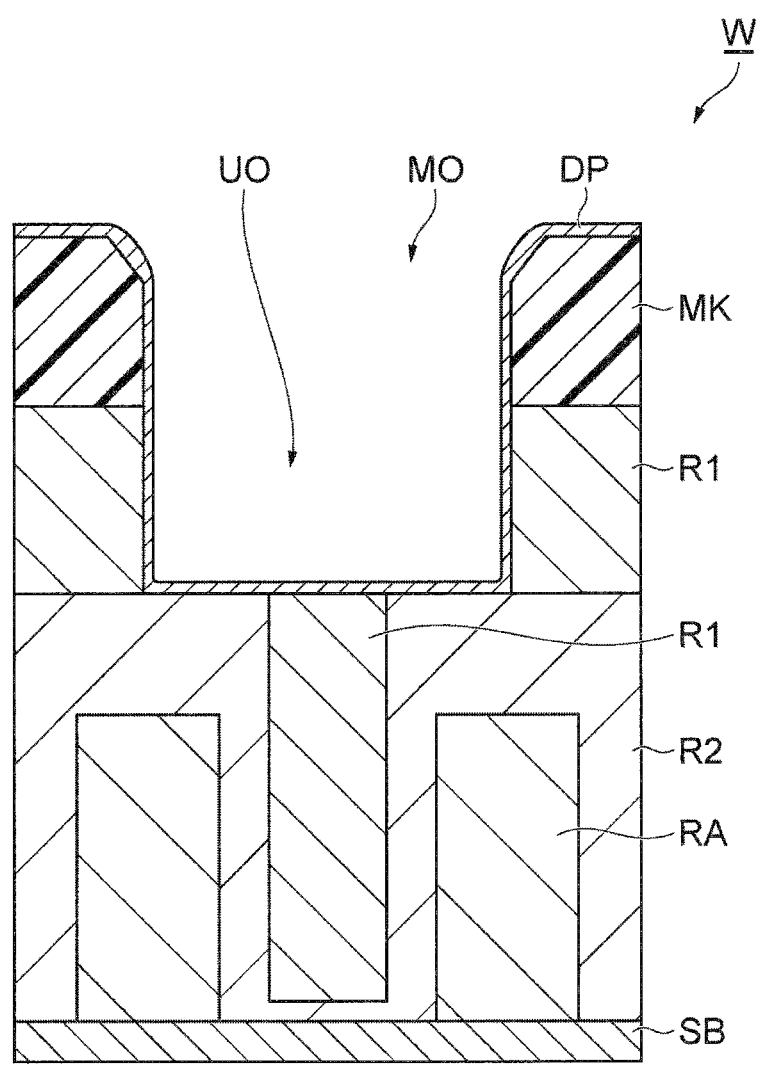
FIG. 9 is a cross-sectional view illustrating the workpiece in a stage during the performance of the method illustrated in FIG. 1.

In step ST12, active species of oxygen are generated, and the amount of the deposit DP on the wafer W is appropriately reduced by the active species of oxygen, as illustrated in FIG. 9. As a result, blockage of the opening MO and the upper opening UO by excessive deposit DP is suppressed. Further, in the processing gas used in step ST12, since the oxygen gas is diluted by the inert gas, the deposit DP is suppressed from being excessively removed.

Hereinafter, various conditions in step ST12 are exemplified.

Pressure in processing container: 10 mTorr (1.33 Pa) to 50 mTorr (6.65 Pa)
Processing gas
  $O_2$ gas: 2 sccm to 20 sccm
  Ar gas: 500 sccm to 1,500 sccm
Power of high frequency waves for plasma generation: 100 W to 500 W
Power of high frequency bias: 0 W In an exemplary embodiment, step ST12 of each sequence, that is, a single step ST12 is performed for 2 seconds or more. In addition, in step ST12, the deposit DP may be etched at a rate of 1 nm/sec or less. In order to perform the sequence using a plasma processing apparatus such as the plasma processing apparatus 10, it takes time to switch the gases for transition between respective steps of step ST11, step ST12, and step ST13. Therefore, considering the time required for the stabilization of discharge, step ST12 needs to be performed for 2 seconds or more. However, when the etching rate of the deposit DP is too high during such a period of time, the deposit for protecting the second region R2 may be excessively removed. Thus, in step ST12, the deposit DP is etched at a rate of 1 nm/sec or less. Accordingly, it is possible to appropriately adjust the amount of the deposit DP formed on the wafer W. Further, the rate of 1 nm/sec or less for the etching of the deposit DP in step ST12 may be achieved by selecting the pressure in the processing container, a degree of dilution of the oxygen in the processing gas with the noble gas, that is, the oxygen concentration, and the power of the high frequency waves for plasma generation within the conditions described above.

In the subsequent step ST13, the first region R1 is etched. In step ST13, a processing is performed to facilitate the reaction of the fluorocarbon in the deposit DP and the silicon oxide of the first region R1. Therefore, in step ST13, the processing gas is supplied into the processing container 12 from a gas source selected among the plurality of gas sources of the gas source group 40. The processing gas contains an inert gas. In an example, the inert gas may be a noble gas such as Ar gas. Alternatively, the inert gas may be nitrogen gas. Further, in step ST13, the exhaust device 50 is operated, so that the pressure in the processing container 12 is set to a predetermined pressure. Further, in step ST13, the high frequency waves from the first high frequency power source 62 are supplied to the lower electrode LE. Further, in step ST13, the high frequency bias from the first high frequency power source 64 is supplied to the lower electrode LE.

Figure 10:
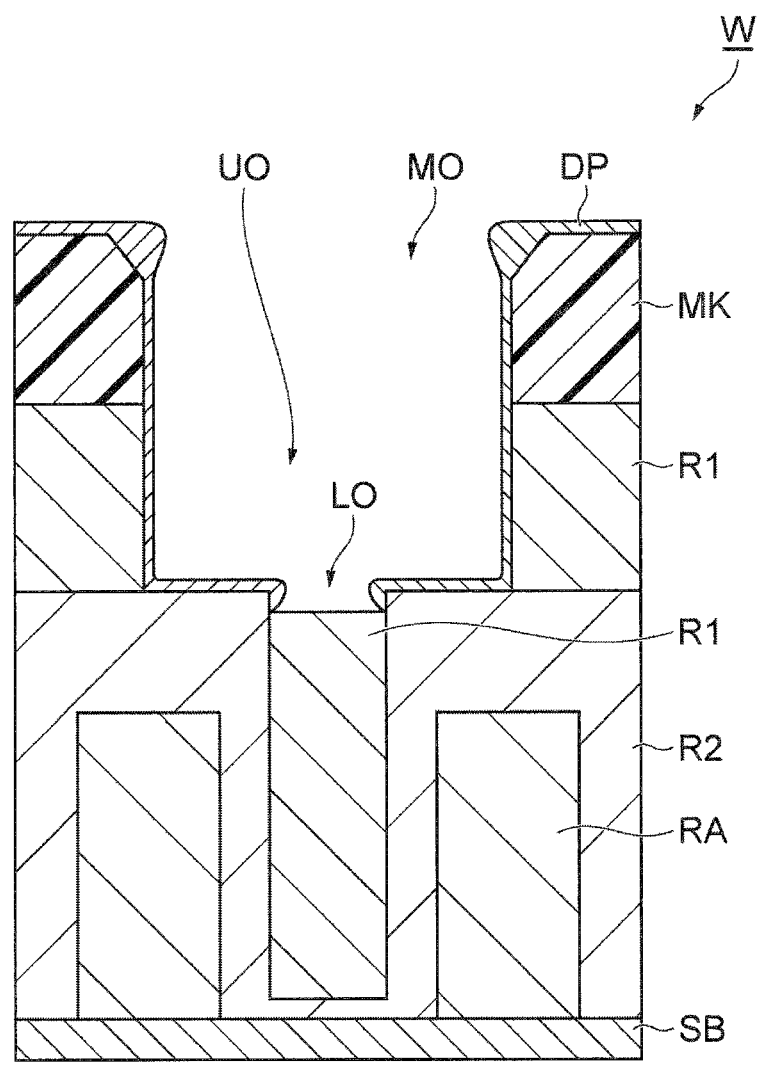
FIG. 10 is a cross-sectional view illustrating the workpiece in a stage during the performance of the method illustrated in FIG. 1.

Hereinafter, various conditions in step ST13 are exemplified.
Pressure in processing container: 10 mTorr (1.33 Pa) to 50 mTorr (6.65 Pa)
Processing gas
 Ar gas: 500 sccm to 1,500 sccm
Power of high frequency waves for plasma generation: 100 W to 500 W
Power of high frequency bias: 20 W to 300 W In step ST13, plasma of the inert gas is generated, and ions are drawn to the wafer W. Accordingly, the reaction of the radicals of the fluorocarbon contained in the deposit DP and the silicon oxide of the first region R1 is facilitated, so that the first region R1 is etched. By the performance of step ST13, as illustrated in FIG. 10, the first region R1 in the recess provided by the second region R2 is etched, so that a lower opening LO is formed.

The number of times for the performance of the sequence SQ1 is set depending on, for example, the film thickness of the first region R1 in the recess defined by the second region R2. For example, the number of times for the performance of the sequence SQ1 may be 1, as long as the first region R1 in the recess can be etched to the bottom of the recess. In this case, the determination of step STa (to be described later) is not necessary, and after the performance of the sequence SQ1, a sequence SQ2 (to be described later) is performed.

Figure 11:
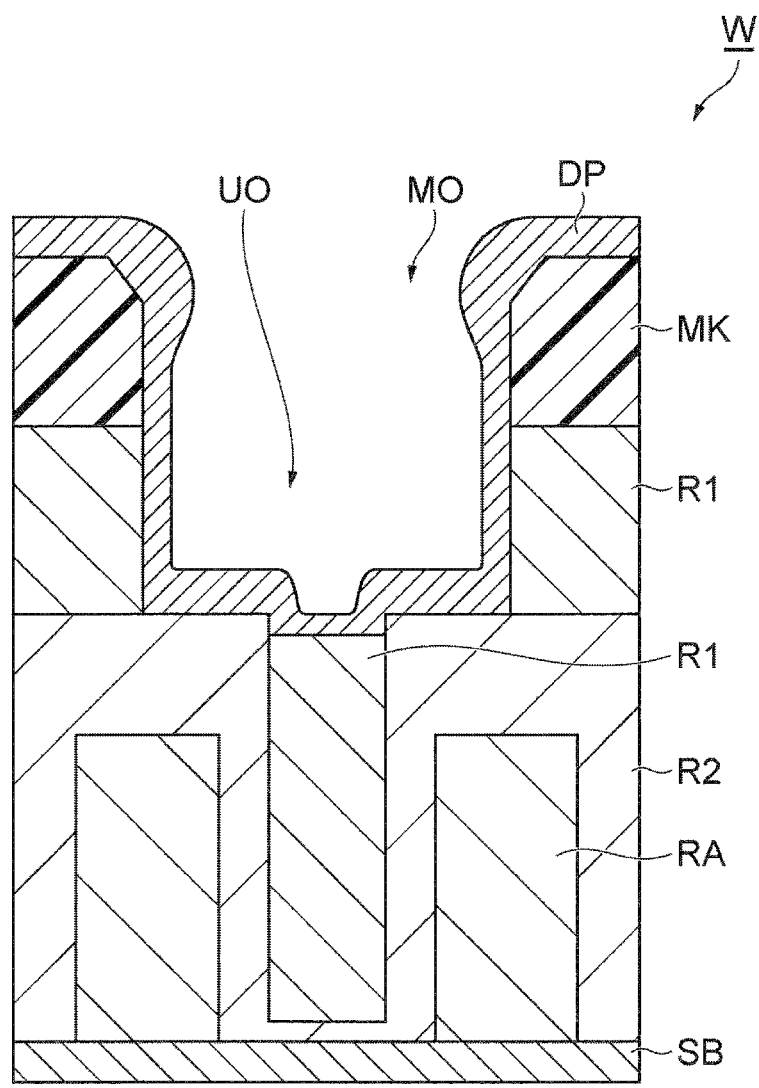
FIG. 11 is a cross-sectional view illustrating the workpiece in a stage during the performance of the method illustrated in FIG. 1.
Figure 12:
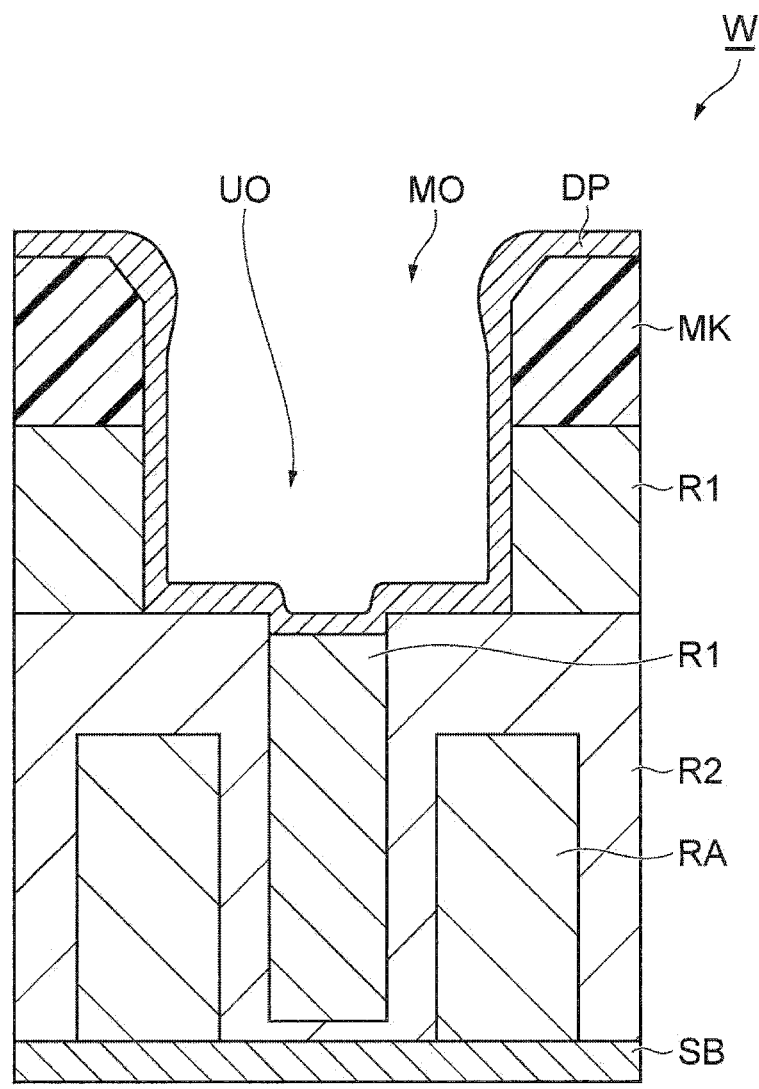
FIG. 12 is a cross-sectional view illustrating the workpiece in a stage during the performance of the method illustrated in FIG. 1.
Figure 13:
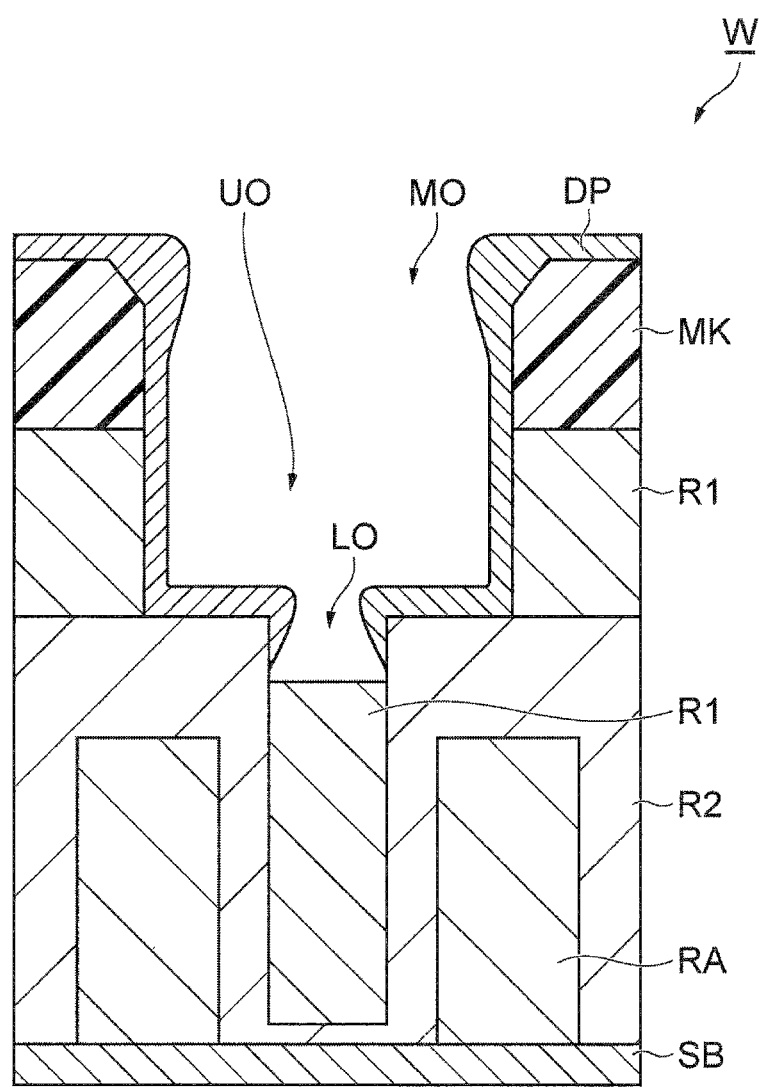
FIG. 13 is a cross-sectional view illustrating the workpiece in a stage during the performance of the method illustrated in FIG. 1.
Figure 14:
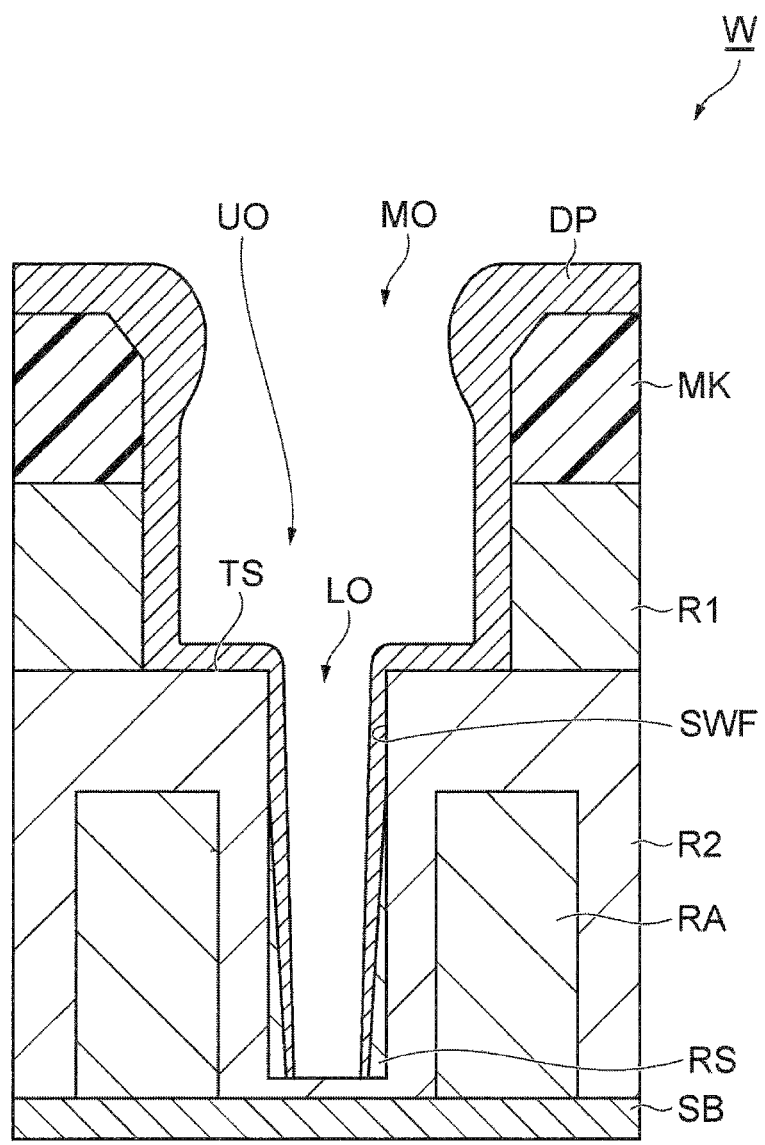
FIG. 14 is a cross-sectional view illustrating the workpiece in a stage during the performance of the method illustrated in FIG. 1.

In an exemplary embodiment, the sequence SQ1 is performed repeatedly. That is, the sequence SQ1 is performed a plurality of times. In the exemplary embodiment, it is determined whether a stop condition is satisfied in step STa. The stop condition is determined to be satisfied when the sequence SQ1 is performed a predetermined number of times. In step STa, when it is determined that the stop condition is not satisfied, the sequence SQ1 is performed from step ST11. In the exemplary embodiment, as the sequence SQ1 is repeated, the deposit DP is formed on the wafer W in step ST11, as illustrated in FIG. 11. Then, in step ST12, the amount of the deposit DP is reduced, as illustrated in FIG. 12. Then, in step ST13, the first region R1 is further etched, so that the depth of the lower opening LO is increased, as illustrated in FIG. 13. Finally, the first region R1 is etched until the second region R2 present on the bottom of the recess is exposed, as illustrated in FIG. 14. Meanwhile, when it is determined that the stop condition is satisfied in step STa, a sequence SQ2 is subsequently performed once or more.

As illustrated in FIG. 14, the deposit DP formed in the sequence SQ1 of method MT is formed on the mask MK and on a top surface TS of the second region R2, as well as along a sidewall surface SWF of the second region R2 that defines the recess. Etching of the first region R1 in the portion adjacent to the sidewall surface SWF is inhibited by the deposit DP. As a result, after the performance of the sequence SQ1, a residue RS of the first region R1 is generated in the portion adjacent to the sidewall surface SWF. In method MT, the sequence SQ2 is performed once or more to remove the residue RS. The sequence SQ2 includes step ST21 and step ST22.

Figure 15:
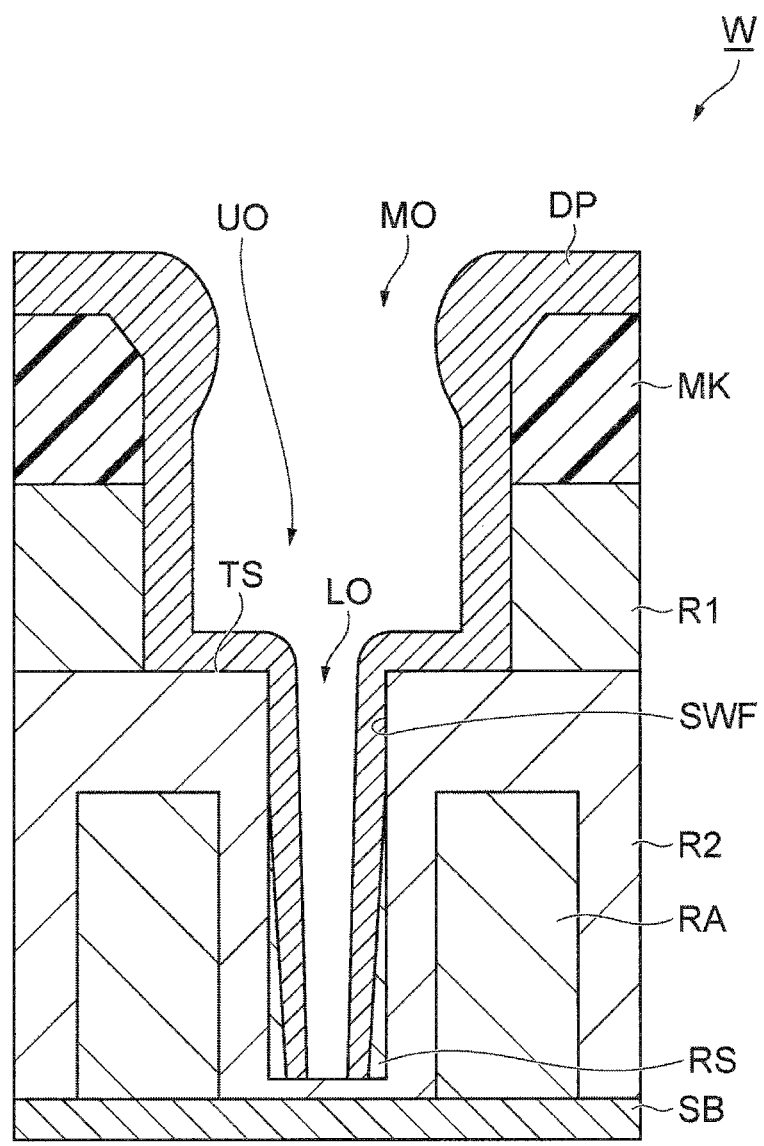
FIG. 15 is a cross-sectional view illustrating the workpiece in a stage during the performance of the method illustrated in FIG. 1.

In step ST21, plasma of a processing gas is generated in the processing container 12 in which the wafer W is accommodated. Therefore, in step ST21, the processing gas is supplied into the processing container 12 from a gas source selected among the plurality of gas sources of the gas source group 40. The processing gas contains a fluorocarbon gas. The processing gas may further contain a noble gas, for example, Ar gas. Further, in step ST21, the exhaust device 50 is operated, so that the pressure in the processing container 12 is set to a predetermined pressure. Further, in step ST21, the high frequency waves from the first high frequency power source 62 are supplied to the lower electrode LE. Accordingly, plasma of the processing gas containing the fluorocarbon gas is generated, and dissociated fluorocarbon is deposited on the surface of the wafer W, so that a deposit DP is formed as illustrated in FIG. 15.

In step ST21, a condition of the deposition mode is selected. Thus, in an example, $C_4F_6$ gas is used as the fluorocarbon gas. Further, in step ST21 of an exemplary embodiment, a power of high frequency waves used for generating the plasma is set to be greater than a power of high frequency waves used for generating the plasma in step ST11.

Hereinafter, various conditions in step ST21 are exemplified.
Pressure in processing container: 10 mTorr (1.33 Pa) to 50 mTorr (6.65 Pa)
Processing gas
 $C_4F_6$ gas: 2 sccm to 10 sccm
 Ar gas: 500 sccm to 1,500 sccm
Power of high frequency waves for plasma generation: 100 W to 700 W
Power of high frequency bias: 0 W to 50 W In the subsequent step ST22, plasma of the processing gas containing an oxygen-containing gas and an inert gas is generated in the processing container 12. Therefore, in step ST22, the processing gas is supplied into the processing container 12 from a gas source selected among the plurality of gas sources of the gas source group 40. In an example, the processing gas contains oxygen gas as the oxygen-containing gas. Further, in an example, the processing gas contains a noble gas such as Ar gas, as the inert gas. The inert gas may be nitrogen gas. Further, in step ST22, the exhaust device 50 is operated, so that the pressure in the processing container 12 is set to a predetermined pressure. Further, in step ST22, the high frequency waves from the first high frequency power source 62 are supplied to the lower electrode LE.

In step ST22 of an exemplary embodiment, the high frequency bias from the second high frequency power source 64 is set as a power lower than the power of the high frequency bias form the second high frequency power source 64 used in step ST11. For example, in step ST22, the high frequency bias from the first high frequency power source 64 is set to 0 W. Further, in step ST22 of an exemplary embodiment, the pressure of the space in the processing container 12 is set to be higher than the pressure of the space in the processing container 12 in step ST11.

Hereinafter, various conditions in step ST22 are exemplified.

Pressure in processing container: 40 mTorr (5.33 Pa) to 120 mTorr (16.0 Pa)
Processing gas
$O_2$ gas: 0.1 sccm to 20 sccm
Ar gas: 10 sccm to 500 sccm
Power of high frequency waves for plasma generation: 25 W to 100 W
Power of high frequency bias: 0 W to 25 W In step ST22, active species of oxygen are generated, and the amount of the deposit DP is reduced by the active species of oxygen. Further, the reaction of the fluorocarbon in the deposit DP and the residue RS is facilitated by the active species derived from the plasma of the inert gas, so that the residue RS is reduced as illustrated in FIG. 16.

The number of times for the performance of the sequence SQ2 is preset as the number of times that the residue RS is sufficiently removed. For example, as long as the residue RS is sufficiently removed, the number of times for the performance of the sequence SQ2 may be 1. In this case, the determination of step STb (to be described later) is not necessary, and after the performance of the sequence SQ2, method MT is ended.

In an exemplary embodiment, the sequence SQ2 is performed repeatedly. That is, the sequence SQ2 is performed a plurality of times. In the exemplary embodiment, it is determined whether a stop condition is satisfied in step STb. The stop condition is determined to be satisfied when the sequence SQ2 is performed a predetermined number of times. In step STb, when it is determined that the stop condition is not satisfied, the sequence SQ2 is performed from step ST21. Meanwhile, in step STb, when it is determined that the stop condition is satisfied, method MT is ended. At this time, as illustrated in FIG. 17, the residue RS is removed, and the width in the bottom portion of the lower opening LO is widened.

In method MT described above, the deposit DP formed in step ST11 of the sequence SQ1 functions, with respect to the second region R2, as a film that protects the second region R2. In addition, the deposit DP serves, with respect to the first region R1, as a source of radicals for etching the first region R1 in step ST13. Thus, according to the sequence SQ1, it is possible to etch the first region R1 while suppressing the erosion of the second region R2.

Further, in step ST21 of the sequence SQ2, the deposit DP containing fluorocarbon is further formed on the wafer W after the performance of the sequence SQ1 in order to protect the second region R2, as well as to form a source of radicals for removing the residue of the first region R1. In the subsequent step ST22, plasma of oxygen gas is generated to reduce the deposit DP formed along the sidewall surface SWF. Further, in step ST22, the reaction of the deposit DP and the residue RS is facilitated by the active species derived from the plasma of the inert gas, so that the residue RS is reduced. Therefore, according to method MT, the erosion of the second region R2 is suppressed, and the residue RS of the first region R1 in the recess defined by the second region R2 is reduced.

Further, in step ST11 of the sequence SQ1 and step ST21 of the sequence SQ2, the deposit DP serving as a source of radicals for the etching of the first region R1 is formed on the substantially entire surface of the wafer W. The deposit DP is also deposited on the focus ring FR. Thus, the concentration difference of the radicals for etching the first region R1 in the plane of the wafer W is reduced. As a result, the in-plane uniformity of the etching of the first region R1 is enhanced.

Further, when a plurality of openings with different widths are formed in the first region R1 of a single wafer W, a large amount of the deposit DP is formed in a portion where a wider opening is formed, and a small amount of deposit DP is formed in a portion where a narrower opening is formed. However, the difference in amount of the deposit DP is reduced in step ST12 and step ST22. As a result, the difference in etching rate is reduced in the portions. For example, in the portion where a wider opening is formed, it is possible to suppress reduction in etching rate, or etching stop due to the amount of the deposit DP.

In an exemplary embodiment, as described above, the power of the high frequency waves used for generating the plasma in step ST21 is set to be greater than the power of the high frequency waves used for generating the plasma in step ST11. According to the exemplary embodiment, it is possible to supply the fluorocarbon in a dissociated form suitable for the removal of the residue RS in the recess, into the recess.

Further, in an exemplary embodiment, the pressure in the space in the processing container 12 set in step ST22 is higher than the pressure in the space in the processing container 12 set in step ST11. The power of the high frequency bias supplied to the lower electrode LE in step ST22 is lower than the power of the high frequency bias supplied to the lower electrode LE in step ST11. That is, in the exemplary embodiment, a condition of a high pressure and a low bias is used in step ST22. Under the condition of a high pressure and a low bias, the active species collide with the wafer W more isotropically, as compared with a condition of a low pressure and/or a high bias. Thus, it is possible to efficiently reduce the amounts of the deposit DP formed along the sidewall surface SWF and the residue RS.

In another exemplary embodiment, a condition in the repetition of the sequence SQ1 may be set such that the amount of the first region R1 etched in the sequence SQ1 performed during the period including the time when the second region R2 is exposed (hereinafter, referred to as a "first sub-sequence") is smaller than the amount of the first region R1 etched in the sequence SQ1 performed thereafter (hereinafter, referred to as a "second sub-sequence"). In an example, the performance time length of the first sub-sequence is set to be shorter than the performance time length of the second sub-sequence. In this example, the ratio of the performance time length of step ST11, the performance time length of step ST12, and the performance time length of step ST13 in the first sub-sequence may be set similarly to the ratio of the performance time length of step ST11, the performance time length of step ST12, and the performance time length of step ST13 in the second sub-sequence. For example, in the first sub-sequence, the performance time length of step ST11 is selected in a range of 2 seconds to 5 seconds, the performance time length of step ST12 is selected in a range of 2 seconds to 5 seconds, and the performance time length of step ST13 is selected in a range of 5 seconds to 10 seconds. In addition, in the second sub-sequence, the performance time length of step ST11 is selected in a range of 2 seconds to 10 seconds, the performance time length of step ST12 is selected in a range of 2 seconds to 10 seconds, and the performance time length of step ST13 is selected in a range of 5 seconds to 20 seconds.

The dissociated species of the fluorocarbon produced in step ST11 is deposited on the second region R2 and protects the second region R2. However, when the first region R1 is etched so that the second region R2 is exposed, the dissociated species may etch the second region R2 in a small amount. Thus, in an exemplary embodiment, the first sub-sequence is performed in a period when the second region R2 is exposed. Accordingly, the deposit DP is formed on the wafer W while the etching amount is suppressed, and the second region R2 is protected more securely by the deposit DP. Thereafter, the second sub-sequence is performed with a much etching amount. Thus, according to the exemplary embodiment, it is possible to etch the first region R1 while further suppressing the erosion of the second region R2.

Further, in step ST13 of the sequence SQ1 performed after the second sub-sequence is performed (hereinafter, referred to as a "third sub-sequence"), the power of the high frequency bias may be set to be greater than the power of the high frequency bias used in step ST13 of the first sub-sequence and the second sub-sequence. For example, in step ST13 of the first sub-sequence and the second sub-sequence, the power of the high frequency bias is set to a power of 20 W to 100 W, and in step ST13 of the third sub-sequence, the power of the high frequency is set to a power of 100 W to 300 W. In addition, in the third sub-sequence, in an example, the performance time length of step ST11 is selected in a range of 2 seconds to 10 seconds, the performance time length of step ST12 is selected in a range of 2 seconds to 10 seconds, and the performance time length of step ST13 is selected in a range of 5 seconds to 15 seconds. As such, since a relatively high power of the high frequency bias is used in step ST13 of the third sub-sequence, the energy of ions drawn into the wafer W is increased. As a result, even though the lower opening LO is deep, it is possible to supply ions to the deep portion of the lower opening LO.

Figure 18:
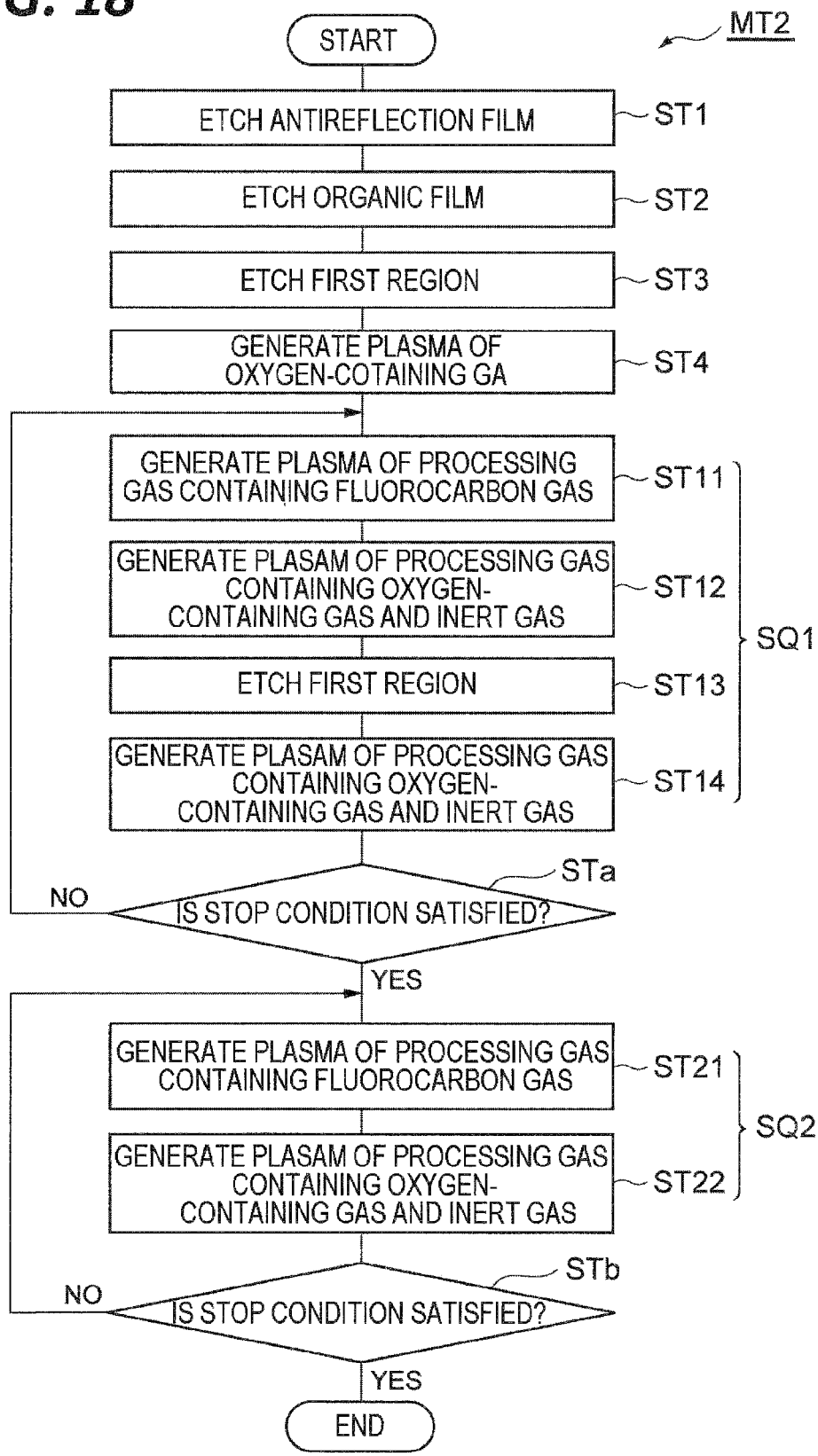
FIG. 18 is a flowchart illustrating an etching method according to another exemplary embodiment.

Hereinafter, an etching method according to another exemplary embodiment will be described. FIG. 18 is a flowchart illustrating an etching method according to another exemplary embodiment. Method MT2 illustrated in FIG. 18 is different from method MT in that the sequence SQ1 further includes step ST14 performed after the performance of step ST13. Further, in a case where method MT2 is performed using the plasma processing apparatus 10, operations of respective parts of the plasma processing apparatus 10 in each step of method MT2 may be controlled by the controller Cnt.

Step ST14 of method MT2 is the same as step ST12. Conditions described above with respect to the processing of step ST12 may be adopted as conditions in the processing of step ST14. As described above, ions are drawn into the wafer W in step ST13. Thus, the substance constituting the deposit DP is released from the wafer W, and the substance is attached again to the wafer W. The substance re-attached to the wafer W constitutes the deposit DP, and may narrow the widths of the opening MO and the lower opening LO. In some cases, it may block the opening MO and the lower opening LO. In method MT2, the wafer W illustrated in FIGS. 10 and 13 is exposed to the active species of oxygen by the performance of step ST14. Accordingly, it is possible to reduce the deposit DP that narrows the widths of the opening MO and the lower opening LO. As a result, it is possible to more securely suppress the blockage of the opening MO and the lower opening LO.

Figure 19:
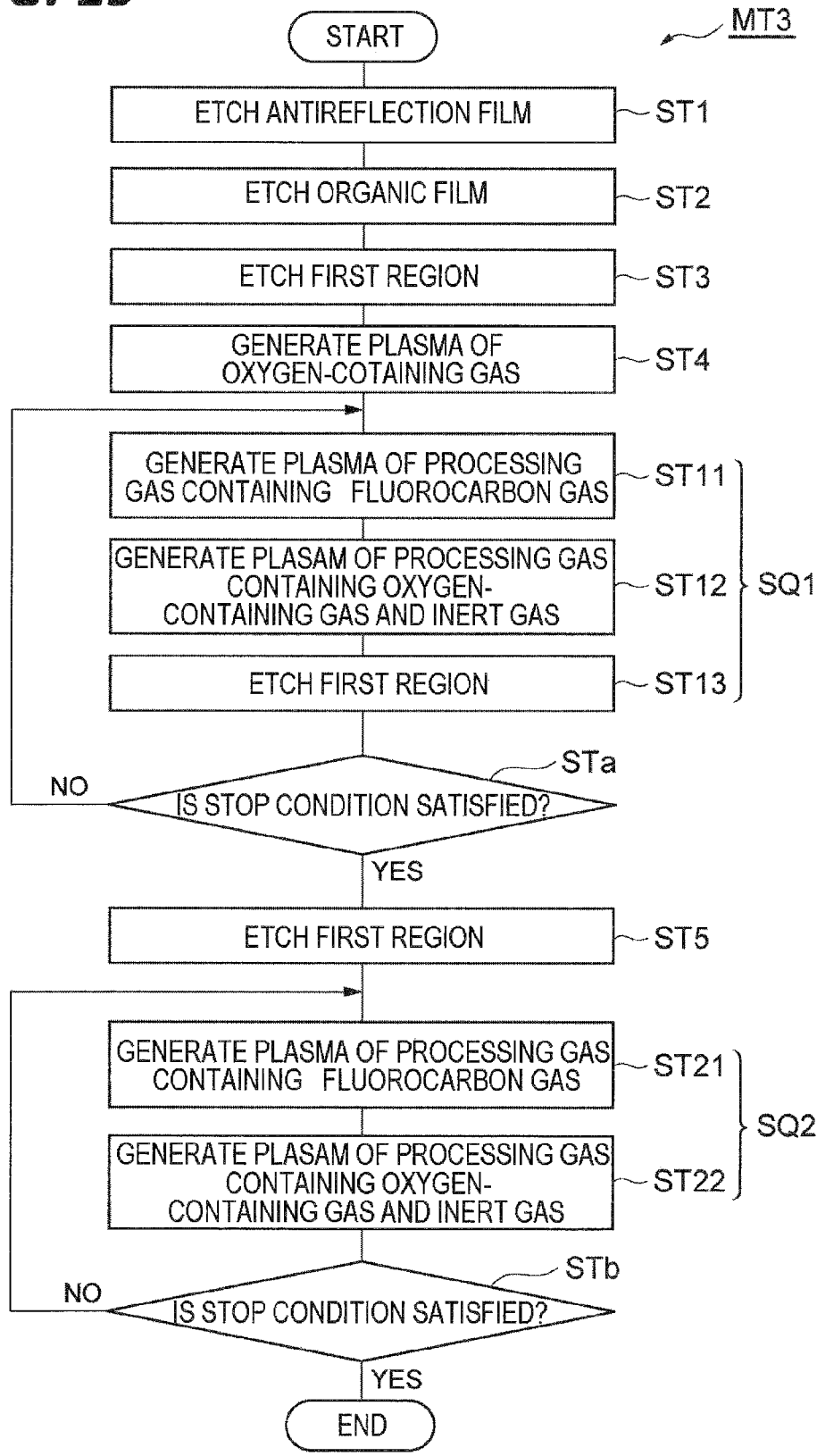
FIG. 19 is a flowchart illustrating an etching method according to still another exemplary embodiment.

Hereinafter, an etching method according to still another exemplary embodiment will be described. FIG. 19 is a flowchart illustrating an etching method according to still another exemplary embodiment. Method MT3 illustrated in FIG. 19 is different from method MT and method MT2 in that step ST5 is further included. Further, in a case where method MT3 is performed using the plasma processing apparatus 10, operations of respective parts of the plasma processing apparatus 10 in each step of method MT3 may be controlled by the controller Cnt.

In method MT3, the sequence SQ1 is performed in a period including the time when the second region R2 is exposed. That is, the sequence SQ1 is performed such that, when the second region R2 is exposed, a deposit is forming on the second region R2 to sufficiently protect the second region R2. Then, after the performance of the sequence SQ1, step ST5 is performed to etch the first region R1 to the bottom of the recess. Thereafter, the sequence SQ2 is performed. That is, step ST5 is performed between the sequence SQ1 performed once or more and the sequence SQ2 performed once or more.

In step ST5, a processing gas (a second processing gas) is supplied into the processing container 12 from a gas source selected among the plurality of gas sources of the gas source group 40. The processing gas contains a fluorocarbon gas. The processing gas may further contain a noble gas, for example, Ar gas. Further, the processing gas may further contain oxygen gas. Further, in step ST5, the exhaust device 50 is operated, so that the pressure in the processing container 5 is set to a predetermined pressure. Further, in step ST5, the high frequency waves from the first high frequency power source 62 are supplied to the lower electrode LE. Furthermore, the high frequency bias from the second high frequency power source 64 is supplied to the lower electrode LE.

In step ST5, plasma of the processing is generated, and the first region R1 in the recess is etched by the active species of fluorocarbon and/or fluorine. In step ST5, a condition of the etching mode is selected. Thus, in an example, the fluorocarbon gas used in step ST5 may include $C_4F_6$ gas. Further, the fluorocarbon gas used in step ST5 may include one or more selected from $C_4F_8$ gas and $CF_4$ gas. Further, in an example, in order to enhance a dissociation rate of the fluorocarbon gas, the power of the high frequency waves for plasma generation used in step ST5 may be set to be greater than the power of the high frequency waves for plasma generation used in step ST11. Further, in an example, the power of the high frequency bias used in step ST5 may also be set to be greater than the power of the high frequency bias of step ST11. According to the example, the energy of ions drawn into the wafer W is increased, so that the first region R1 may be etched at a high speed.

Hereinafter, various conditions in step ST5 are exemplified.

Pressure in processing container: 10 mTorr (1.33 Pa) to 50 mTorr (6.65 Pa)
Processing gas
$C_4F_6$ gas: 2 sccm to 10 sccm
Ar gas: 500 sccm to 2,000 sccm
$O_2$ gas: 2 sccm to 20 sccm Power of high frequency waves for plasma generation: 100 W to 500 W
Power of high frequency bias: 20 W to 300 W
Voltage of power source 70: 0 V to 900 V In method MT3, step ST5 is performed in a state where the second region R2 is protected by the deposit DP formed by the performance of the sequence SQ1. In step ST5, the first region R1 is further etched by the plasma of the fluorocarbon gas. The etching rate of the first region R1 in step ST5 is higher than the etching rate of the first region R1 in the sequence SQ1. Therefore, according to method MT3, the first region R1 may be etched to the bottom of the recess in a shorter time. Further, according to method MT3, it is possible to reduce the residue RS after the performance of step ST5.

As such, various exemplary embodiments have been described, but various modifications may be made without being limited to the exemplary embodiments described above. For example, in each step of method MT, method MT2, and method MT3, the high frequency waves for plasma generation may be supplied to the upper electrode 30 instead of the lower electrode LE. Further, in the performance of method MT, method MT2, and method MT3, any plasma processing apparatus other than the plasma processing apparatus 10 may be used. For example, method MT, method MT2, and method MT3 may be performed using any plasma processing apparatus such as, for example, an inductively coupled plasma processing apparatus, or a plasma processing apparatus for generating plasma with surface waves such as microwaves.

Further, step ST11, step ST12, and step ST13 of the sequence SQ1 may be performed in a different order. For example, in the sequence SQ1, step ST12 may be performed after the performance of step ST13.

Further, step ST3 may be omitted from method MT, method MT2, and method MT3. In this case, the sequence SQ1 may be performed instead of step ST3 in order to form the upper opening UO.

Hereinafter, descriptions will be made on Test Examples 1 to 3 performed for evaluation of method MT, but the present disclosure is not limited to these test examples.

Figure 20A:
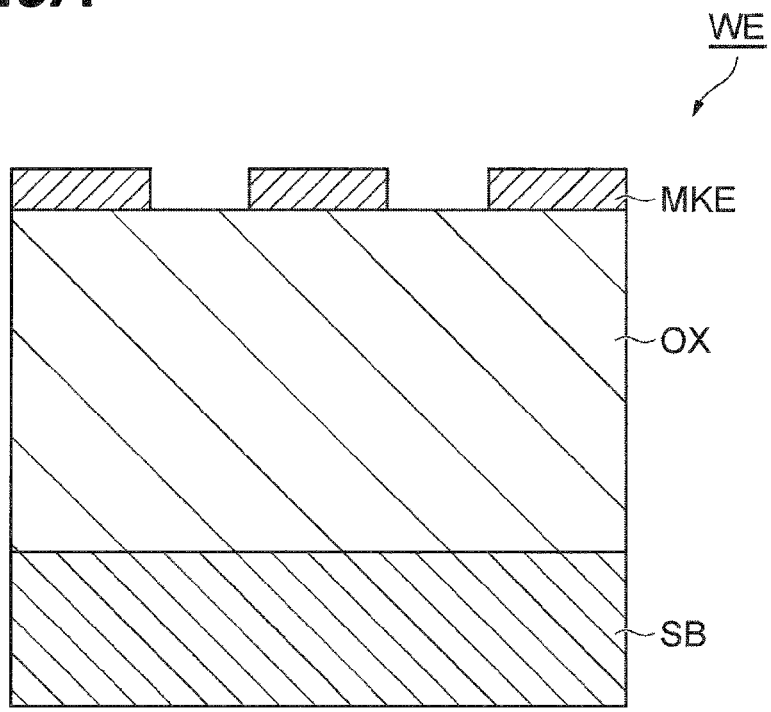
FIGS. 20A and 20B are views illustrating a wafer used in a test.

In Test Examples 1 to 3, a wafer WE illustrated in FIG. 20A was prepared. The wafer WE included a silicon oxide film OX on a substrate SB, and a mask MKE on the silicon oxide film OX. The film thickness of the silicon oxide film OX was 2 µm, and the width of the opening of the mask MKE was 19 nm. In Test Examples 1 to 3, the sequence SQ1 was performed 12 times on the wafer WE using the plasma processing apparatus 10, and then, the sequence SQ2 was performed. The number of times for the performance of the sequence SQ2 in Test Examples 1 to 3 was 6, 12, and 18, respectively. In addition, in Comparative Test Example, a wafer WE was prepared, and the sequence SQ1 was performed 12 times on the wafer WE using the plasma processing apparatus 10. In Comparative Test Example, the sequence SQ2 was not performed.

Figure 20B:
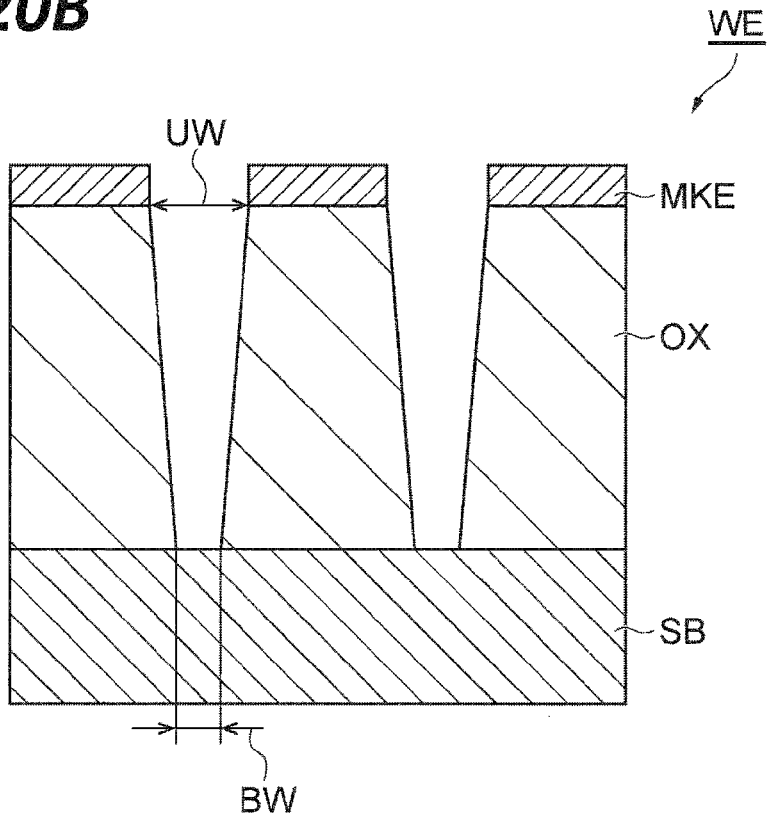

Conditions of the sequence SQ1 in Test Examples 1 to 3 and Comparative Test Example are listed:
<Step ST11>
Pressure of space in processing container 12: 20 mTorr (2.66 Pa)
$C_4F_6$ gas flow rate: 4 sccm
Ar gas flow rate: 750 sccm
High frequency waves for plasma generation: 40 MHz, 300 W
High frequency bias: 13 MHz, 50 W
Processing time: 10 seconds
<Step ST12>
Pressure of space in processing container 12: 80 mTorr (10.6 Pa)
Ar gas flow rate: 100 sccm
$O_2$ gas flow rate: 3 sccm
High frequency waves for plasma generation: 40 MHz, 50 W
High frequency bias: 13 MHz, 0 W
Processing time: 4 seconds
<Step ST13>
Pressure of space in processing container 12: 20 mTorr (2.66 Pa)
Ar gas flow rate: 950 sccm
High frequency waves for plasma generation: 40 MHz, 500 W
High frequency bias: 13 MHz, 50 W
Processing time: 4 seconds Conditions of the sequence SQ2 in Test Examples 1 to 3 are listed:
<Step ST21>
Pressure of space in processing container 12: 20 mTorr (2.66 Pa)
$C_4F_6$ gas flow rate: 4 sccm
Ar gas flow rate: 750 sccm
High frequency waves for plasma generation: 40 MHz, 500 W
High frequency bias: 13 MHz, 0 W
Processing time: 10 seconds
<Step ST22>
Pressure of space in processing container 12: 80 mTorr (10.6 Pa)
Ar gas flow rate: 100 sccm
$O_2$ gas flow rate: 3 sccm
High frequency waves for plasma generation: 40 MHz, 50 W
High frequency bias: 13 MHz, 0 W
Processing time: 4 seconds In Test Examples 1 to 3 and Comparative Test Example, an ashing processing was performed after the silicon oxide film OX was etched by the processing under the conditions described above. And, in Test Examples 1 to 3 and Comparative Test Example, as illustrated in FIG. 20B, a width UW of the upper end of an opening formed in the silicon oxide film OX of the wafer WE, and a width BW of the bottom portion of the opening were measured from a SEM image of the wafer WE. As a result, in Test Example 1, the width UW was 21.6 nm, and the width BW was 12.7 nm. In Test Example 2, the width UW was 22.2 nm, and the width BW was 15.9 nm. In Test Example 3, the width UW was 23.5 nm, and the width BW was 19.7 nm. Further, In Comparative Test Example, the width UW was 21.0 nm, and the width BW was 6.4 nm. Therefore, in Test Examples 1 to 3, it has been confirmed that the width of the bottom portion of the opening may be widened, as compared with Comparative Test Example.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A method for selectively etching a first region made of silicon oxide to a second region made of silicon nitride, wherein the second region defines a recess, the first region fills the recess and covers the second region, and a mask is provided above the first region, the method comprising:
- performing a first sequence a plurality of times to etch the first region such that the second region is exposed; and
- performing a second sequence once or more to further etch the first region,
- the first sequence includes:
- a first step of generating plasma of a processing gas containing a fluorocarbon gas in a processing container of a plasma processing apparatus to form a fluorocarbon-containing deposit on a workpiece ; and
- a second step of etching the first region by radicals of the fluorocarbon contained in the deposit,
- the performing the second sequence once or more is performed on the workpiece processed by the performing the first sequence a plurality of times, and
- the second sequence includes:
- a third step of generating plasma of a processing gas containing a fluorocarbon gas in the processing container to form a fluorocarbon-containing deposit on the workpiece; and
- a fourth step of generating plasma of a processing gas containing oxygen gas and an inert gas in the processing container.

2. The method of claim 1, wherein a power of high frequency waves used for generating the plasma in the third step is greater than a power of high frequency waves used for generating the plasma in the first step.

3. The method of claim 1, wherein the workpiece is placed on a placing table in the processing container,
- a pressure in a space in the processing container set in the fourth step is higher than a pressure in a space in the processing container set in the first step, and
- a power of a high frequency bias supplied to the placing table in the fourth step is smaller than a power of a high frequency bias supplied to the placing table in the first step.

4. The method of claim 1, wherein the first sequence further includes a step of generating plasma of a processing gas containing oxygen gas and an inert gas in the processing container.

5. The method of claim 1, wherein the performing the first sequence a plurality of times is performed during a period including a time when the second region is exposed, and the method further comprising:
- etching the first region to the bottom of the recess by the plasma of the processing gas containing the fluorocarbon gas generated in the processing container, between the performing the first sequence a plurality of times and the performing the second sequence once or more.

6. The method of claim 1, further comprising:
- generating plasma of a processing gas containing a fluorocarbon gas in the processing container of the plasma processing apparatus to etch a portion of the first region just until the second region is exposed.

7. The method of claim 1, wherein, in the second step, plasma of an inert gas is generated, and power of high frequency bias is supplied to a placing table where the workpiece is placed.

8. The method of claim 1, wherein the first sequence includes:
- a first sub-sequence that executes the first sequence at least once or more until the second region is exposed; and
- after the first sub-sequence, a second sub-sequence that executes the first sequence at least once or more.

9. The method of claim 8, wherein an execution time of one first sequence executed in the first sub-sequence is shorter than an execution time of one first sequence executed in the second sub-sequence.

10. The method of claim 8, wherein the first sequence includes a third sub-sequence that executes the first sequence at least once or more after the second sub-sequence,
- in the second step of each of the first sub-sequence, the second sub-sequence, and the third sub-sequence, plasma of an inert gas is generated, and power of high frequency bias is supplied to a placing table where the workpiece is placed, and
- power of high frequency bias supplied in the second step of the third sub-sequence is higher than power of high frequency bias supplied in the second step of the first sub-sequence and the second sub-sequence.

* * * * *